United States Patent
Chung et al.

(10) Patent No.: US 10,615,264 B2
(45) Date of Patent: *Apr. 7, 2020

(54) SEMICONDUCTOR DEVICES

(71) Applicant: Samsung Electronics Co., Ltd., Suwon-si (KR)

(72) Inventors: Wonkeun Chung, Seoul (KR); Jae-Jung Kim, Suwon-si (KR); Jinkyu Jang, Hwaseong-si (KR); Sangyong Kim, Suwon-si (KR); Hoonjoo Na, Hwaseong-si (KR); Dongsoo Lee, Gunpo-si (KR); Sangjin Hyun, Suwon-si (KR)

(73) Assignee: Samsung Electronic Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/592,309

(22) Filed: Oct. 3, 2019

(65) Prior Publication Data

US 2020/0035801 A1 Jan. 30, 2020

Related U.S. Application Data

(63) Continuation of application No. 15/938,716, filed on Mar. 28, 2018, now Pat. No. 10,475,898.

(30) Foreign Application Priority Data

Sep. 8, 2017 (KR) .......................... 10-2017-0115343

(51) Int. Cl.
*H01L 21/28* (2006.01)
*H01L 29/423* (2006.01)
(Continued)

(52) U.S. Cl.
CPC ........ *H01L 29/42392* (2013.01); *B82Y 10/00* (2013.01); *H01L 21/28088* (2013.01);
(Continued)

(58) Field of Classification Search
CPC ......... H01L 29/42392; H01L 29/78642; H01L 21/28114; H01L 21/28088; H01L 29/517;
(Continued)

(56) References Cited

U.S. PATENT DOCUMENTS 7,651,901 B2 1/2010 Nakajima
8,188,551 B2 5/2012 Schulz et al.
(Continued)

*Primary Examiner* — Caleen O Sullivan
(74) *Attorney, Agent, or Firm* — Myers Bigel, P.A.

(57) ABSTRACT

A semiconductor device includes first semiconductor patterns vertically stacked on a substrate and vertically spaced apart from each other, and a first gate electrode on the first semiconductor patterns. The first gate electrode comprises a first work function metal pattern on a top surface, a bottom surface, and sidewalls of respective ones of the first semiconductor patterns, a barrier pattern on the first work function metal pattern, and a first electrode pattern on the barrier pattern. The first gate electrode has a first part between adjacent ones of the first semiconductor patterns. The barrier pattern comprises a silicon-containing metal nitride layer. The barrier pattern and the first electrode pattern are spaced apart from the first part.

20 Claims, 21 Drawing Sheets

(51) Int. Cl.
    *H01L 29/49*    (2006.01)
    *H01L 29/786*   (2006.01)
    *H01L 29/51*    (2006.01)
    *H01L 27/11*    (2006.01)
    *H01L 29/06*    (2006.01)
    *B82Y 10/00*    (2011.01)
    *H01L 29/775*   (2006.01)
    *H01L 29/66*    (2006.01)

(52) U.S. Cl.
    CPC .... *H01L 21/28114* (2013.01); *H01L 27/1104* (2013.01); *H01L 29/0669* (2013.01); *H01L 29/0673* (2013.01); *H01L 29/40114* (2019.08); *H01L 29/42372* (2013.01); *H01L 29/42376* (2013.01); *H01L 29/4958* (2013.01); *H01L 29/4966* (2013.01); *H01L 29/517* (2013.01); *H01L 29/66439* (2013.01); *H01L 29/775* (2013.01); *H01L 29/78642* (2013.01); *H01L 29/78696* (2013.01)

(58) Field of Classification Search
    CPC ............ H01L 29/4966; H01L 29/4958; H01L 29/42376; H01L 21/28273; H01L 29/42372; H01L 29/0673; H01L 29/78696; H01L 27/1104; H01L 29/0669; H01L 29/775; H01L 29/66439; H01L 29/40114; B82Y 10/00

USPC ........................................................ 257/328
    See application file for complete search history.

(56) References Cited

U.S. PATENT DOCUMENTS

| | | |
|---|---|---|
| 9,012,319 B1 | 4/2015 | Choi et al. |
| 9,337,057 B2 | 6/2016 | Park |
| 9,472,637 B2 | 10/2016 | Horii et al. |
| 9,614,091 B2 | 4/2017 | Colinge et al. |
| 9,620,590 B1 | 4/2017 | Bergendahl et al. |
| 9,634,144 B2 | 4/2017 | An et al. |
| 9,673,279 B2 | 6/2017 | Lee et al. |
| 9,788,759 B2 | 10/2017 | Park et al. |
| 10,475,898 B2 * | 11/2019 | Chung .............. H01L 21/28114 |
| 2013/0221445 A1 | 8/2013 | Lei |
| 2015/0110550 A1 | 4/2015 | Evitt |
| 2015/0262828 A1 | 9/2015 | Brand et al. |
| 2016/0204195 A1 | 7/2016 | Wen |
| 2016/0336421 A1 | 11/2016 | Cheng |
| 2017/0110554 A1 | 4/2017 | Tak et al. |
| 2017/0200738 A1 | 7/2017 | Kim |
| 2017/0250291 A1 | 8/2017 | Lee |
| 2017/0256544 A1 | 9/2017 | Chai et al. |
| 2018/0374926 A1 | 12/2018 | Lee et al. |

* cited by examiner

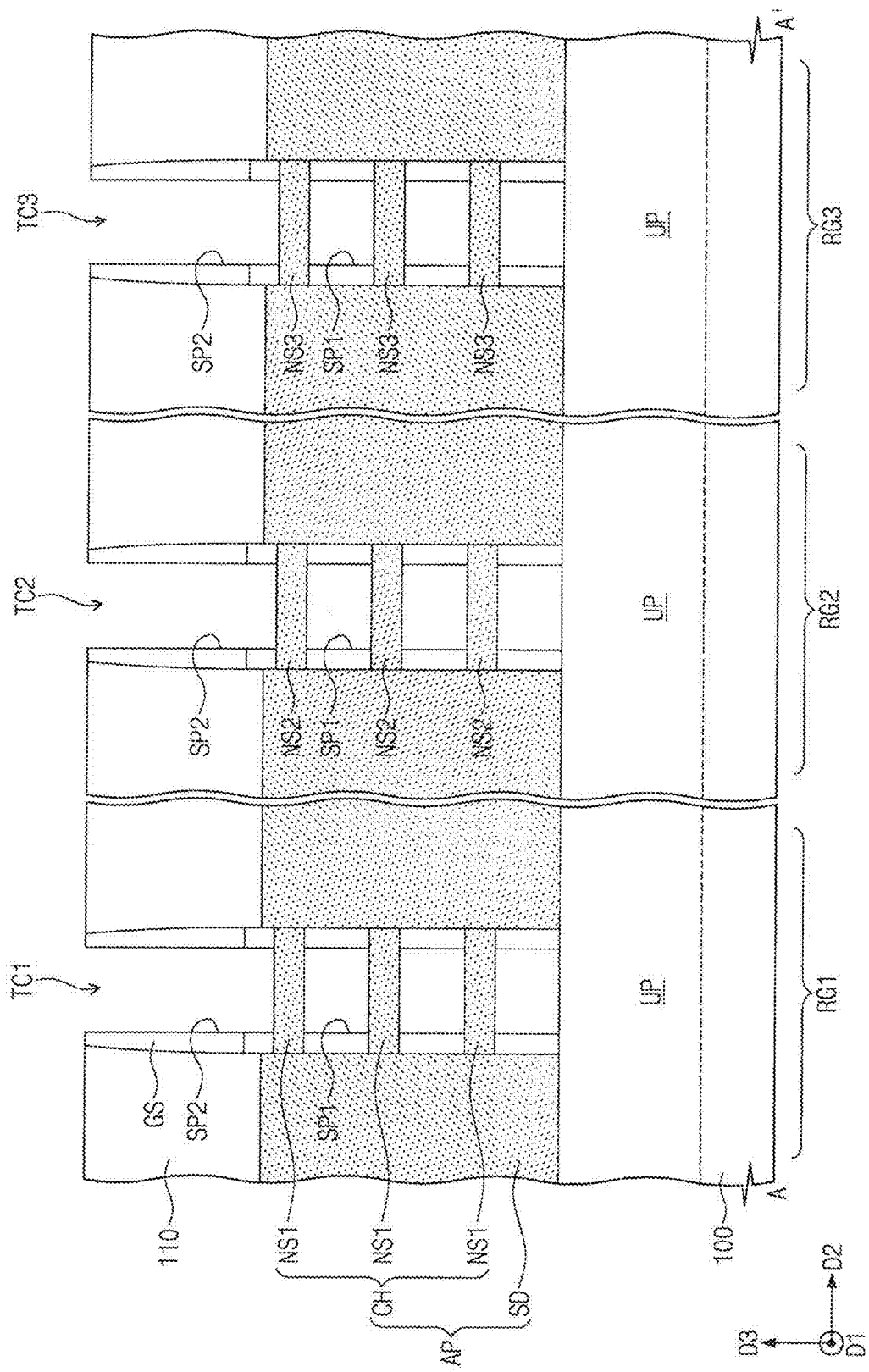

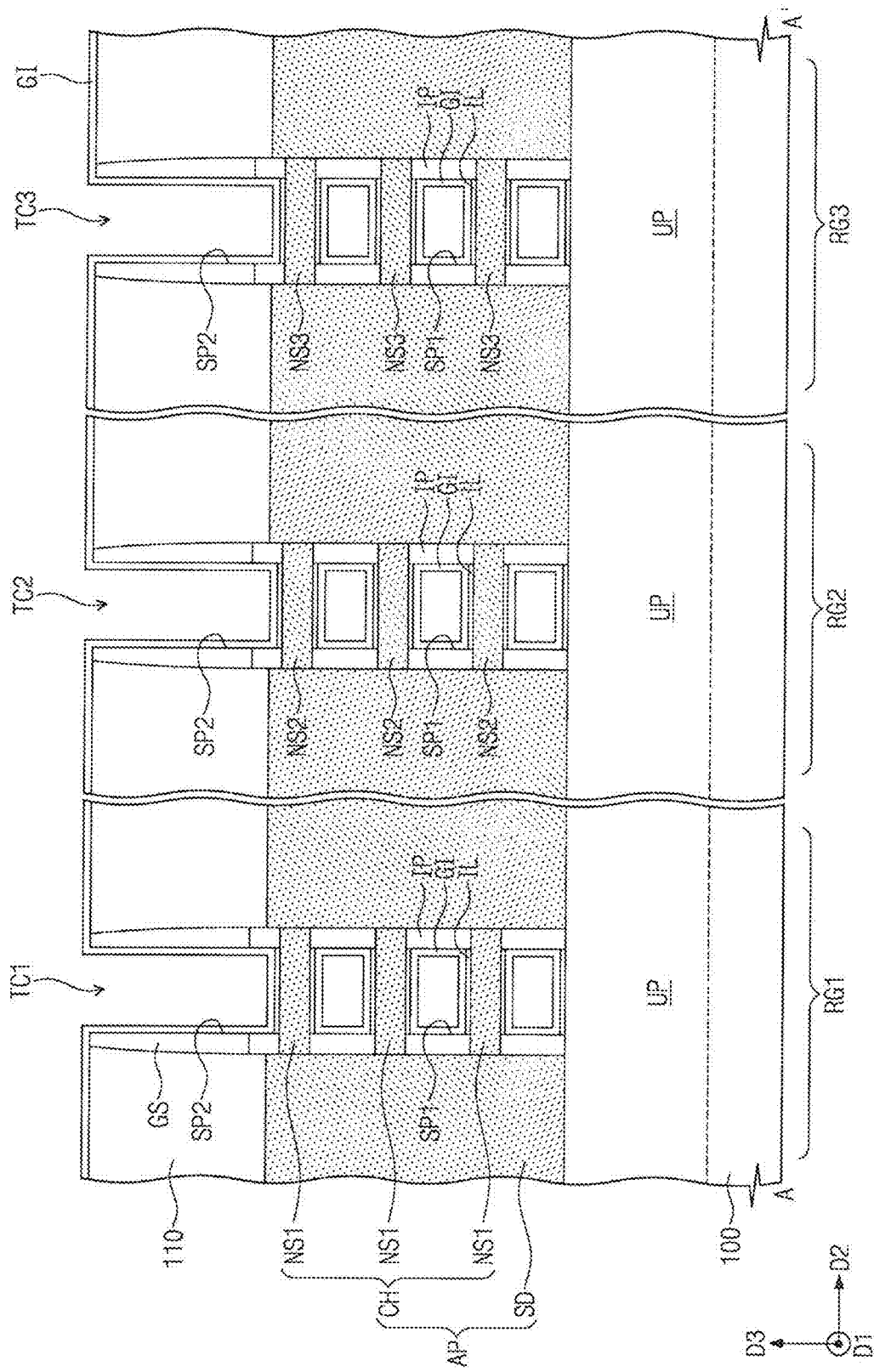

SEMICONDUCTOR DEVICES

CROSS-REFERENCE TO RELATED APPLICATION

This application is a continuation of U.S. patent application Ser. No. 15/938,716, filed on Mar. 28, 2018, which claims priority under 35 U.S.C. § 119 to Korean Patent Application No. 10-2017-0115343 filed on Sep. 8, 2017, the entire contents of which are incorporated herein by reference in their entireties.

BACKGROUND

The present inventive concepts relate to semiconductor devices, and more particularly, to semiconductor devices including a gate-all-around type transistor.

Semiconductor devices are useful in the electronic industry because of their small size, multi-functionality, and/or low fabrication cost. Semiconductor devices may be categorized, for example, as a semiconductor memory device for storing logic data, a semiconductor logic device for processing operations of logic data, and/or a hybrid semiconductor device having both memory and logic elements. Semiconductor devices have been increasingly used for high integration within the electronic industry. For example, semiconductor devices have been increasingly utilized for their high reliability, high speed, and/or multi-functionality. Semiconductor devices have become more complex and integrated to meet these beneficial characteristics.

SUMMARY

Some embodiments of the present inventive concepts provide semiconductor devices including gate-all-around type transistors with various threshold voltages.

According to example embodiments of the present inventive concepts, a semiconductor device may comprise: first semiconductor patterns vertically stacked on a substrate and vertically spaced apart from each other; and a first gate electrode on the first semiconductor patterns. The first gate electrode may comprise: a first work function metal pattern on a top surface, a bottom surface, and sidewalls of respective ones of the first semiconductor patterns; a barrier pattern on the first work function metal pattern; and a first electrode pattern on the barrier pattern. The first gate electrode may have a first part between adjacent ones of the first semiconductor patterns. The barrier pattern may comprise a first metal nitride layer comprising silicon. The barrier pattern and the first electrode pattern may be spaced apart from the first part.

According to example embodiments of the present inventive concepts, a semiconductor device may comprise a first transistor and a second transistor on a substrate. Each of the first and second transistors may comprise: semiconductor patterns vertically stacked on the substrate and vertically spaced apart from each other; and a gate electrode on the semiconductor patterns. The gate electrode of the first transistor may comprise a first work function metal pattern and a first electrode pattern that are sequentially stacked on an uppermost one of the semiconductor patterns of the first transistor. The gate electrode of the second transistor may comprise a second work function metal pattern, a barrier pattern, and a second electrode pattern that are sequentially stacked on an uppermost one of the semiconductor patterns of the second transistor. The first electrode pattern may cover the first work function metal pattern.

According to example embodiments of the present inventive concepts, a semiconductor device may comprise: first semiconductor patterns vertically stacked on a substrate; second semiconductor patterns vertically stacked on the substrate; a first gate electrode on the first semiconductor patterns; and a second gate electrode on the second semiconductor patterns. The first gate electrode may comprise: a first work function metal pattern within a space between adjacent ones of the first semiconductor patterns and on a top surface, a bottom surface, and sidewalls of respective ones of the first semiconductor patterns; and a first electrode pattern on the first work function metal pattern. The second gate electrode may comprise: a second work function metal pattern within a space between adjacent ones of the second semiconductor patterns and on a top surface, a bottom surface, and sidewalls of respective ones of the second semiconductor patterns; a second electrode pattern on the second work function metal pattern; and a barrier pattern between the second work function metal pattern and the second electrode pattern. The first work function metal pattern may comprise a silicon-containing first metal nitride layer. The second work function metal pattern may comprise a second metal nitride layer. The barrier pattern may comprise a silicon-containing third metal nitride layer. The barrier pattern may have a silicon concentration greater than that of the first work function metal pattern.

BRIEF DESCRIPTION OF THE DRAWINGS

The above, and other aspects, features, and advantages of the present disclosure, will be more clearly understood from the following detailed description when taken in conjunction with the accompanying drawings.

FIGS. 7A, 9A, 11A, and 13A illustrate cross-sectional views taken along line A-A' of FIGS. 6, 8, 10, and 12, respectively.

FIGS. 14 to 17 illustrate cross-sectional views showing a method of forming first to third gate electrodes according to example embodiments of the present inventive concepts.

DETAILED DESCRIPTION

Figure 1:
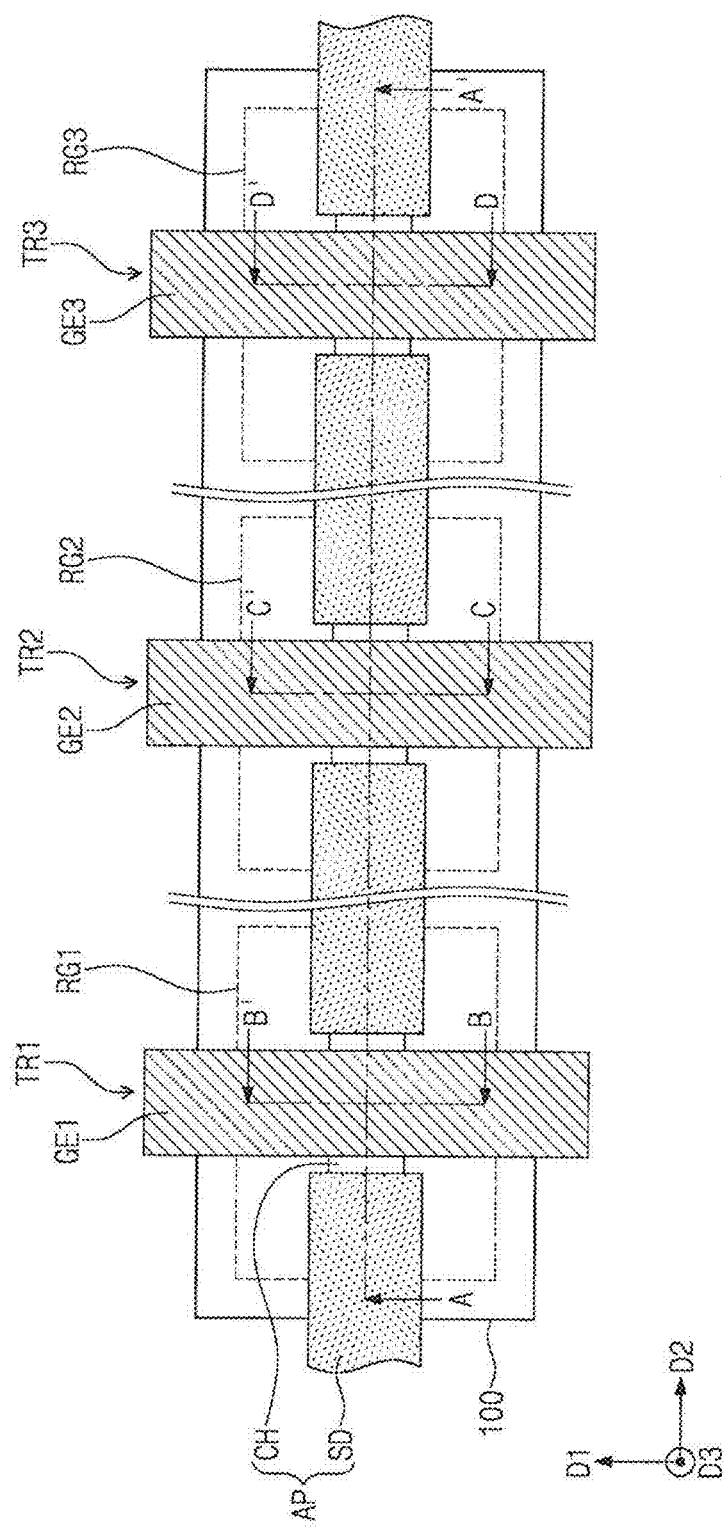
FIG. 1 illustrates a plan view showing a semiconductor device according to example embodiments of the present inventive concepts.
Figure 2A:
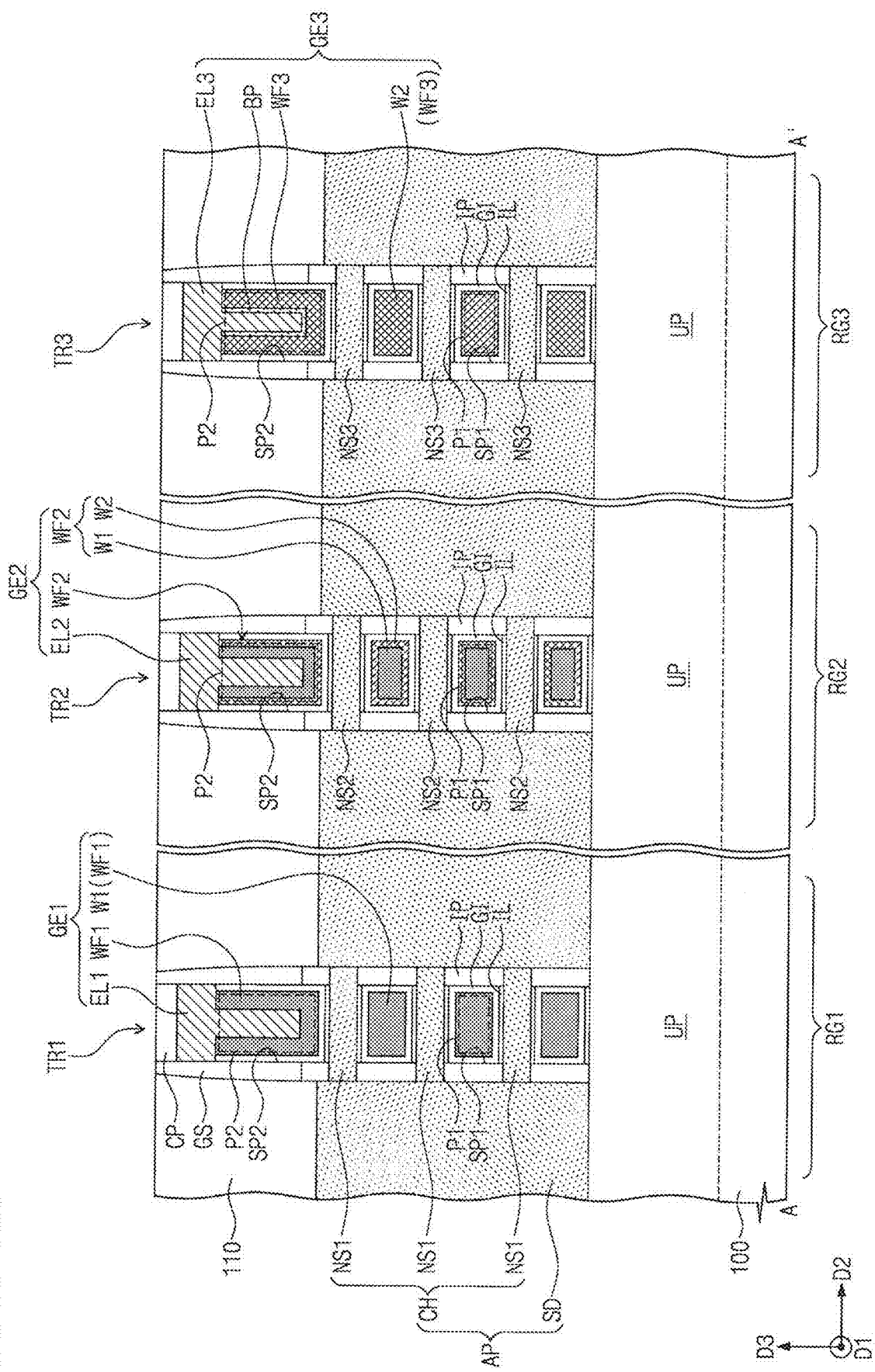
FIG. 2A illustrates a cross-sectional view taken along line A-A' of FIG. 1.

FIG. 1 illustrates a plan view showing a semiconductor device according to example embodiments of the present inventive concepts. FIG. 2A illustrates a cross-sectional view taken along line A-A' of FIG. 1. FIG. 21 illustrates a cross-sectional view taken along lines B-B', C-C', and D-D' of FIG. 1.

Figure 2B:
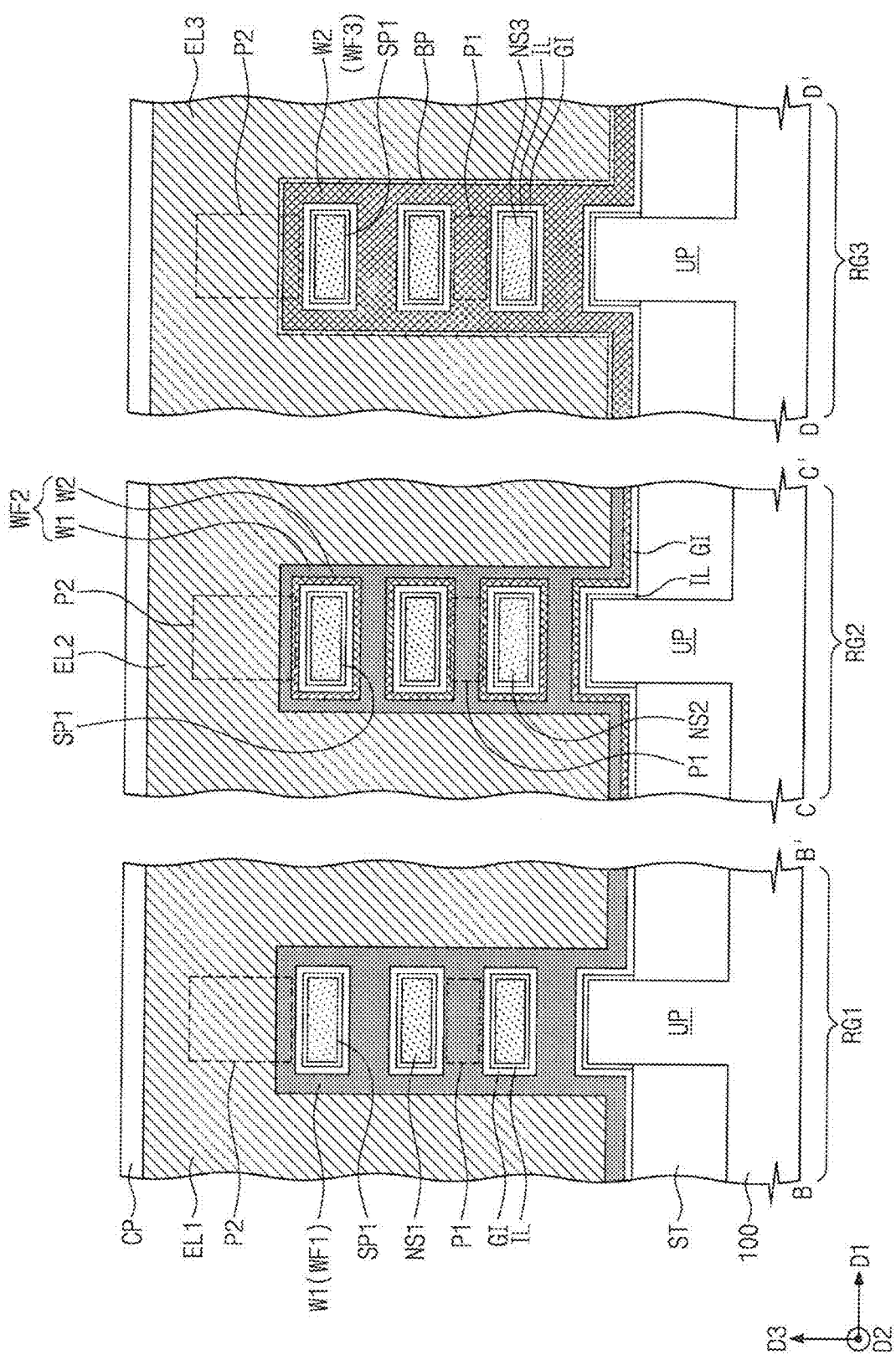
FIG. 2B illustrates a cross-sectional view taken along lines B-B', C-C', and D-D' of FIG. 1.

Referring to FIGS. 1, 2A, and 2B, a substrate 100 may include a first region RG1, a second region RG2, and a third region RG3 (referred to herein as first to third regions RG1 to RG3). The substrate 100 may be a semiconductor substrate. For example, the substrate 100 may be a silicon substrate or a germanium substrate. In some embodiments, the substrate 100 may be an SOI (Silicon-On-Insulator) substrate. A first transistor, TR1, a second transistor TR2, and a third transistor TR3 (referred to herein as first to third transistors TR1 to TR3) may be respectively provided on the first to third regions RG1 to RG3 of the substrate 100.

In some embodiments, the first to third regions RG1 to RG3 of the substrate 100 may be or include a memory cell region where a plurality of memory cells are formed to store data. For example, the memory cell region of the substrate 100 may be provided with memory cell transistors included in a plurality of SRAM cells. The first to third transistors TR1 to TR3 may be some of the memory cell transistors.

In some embodiments, the first to third regions RG1 to RG3 of the substrate 100 may be or include a logic cell region where logic transistors are to be included in a logic circuit of a semiconductor device. For example, logic transistors may be on the logic cell region of the substrate 100. The first to third transistors TR1 to TR3 may be some of the logic transistors. The present inventive concepts, however, are not limited thereto.

The first to third transistors TR1 to TR3 on the first to third regions RG1 to RG3 may have the same conductivity types. For example, the first to third transistors TR1 to TR3 on the first to third regions RG1 to RG3 may be PMOSFETs. In some embodiments, the first to third transistors TR1 to TR3 on the first to third regions RG1 to RG3 may be NMOSFETs.

A device isolation layer ST may be provided on the substrate 100. The device isolation layer ST may define upper patterns UP on an upper portion of the substrate 100. Each of the upper patterns UP may extend on a corresponding one of the first to third regions RG1 to RG3. The upper patterns UP may extend in a second direction D2. The device isolation layer ST may fill trenches on opposite sides of each of the upper patterns UP. The device isolation layer ST may have a top surface lower (e.g., closer to the substrate 100) than top surfaces of the upper patterns UP.

An active pattern AP may be provided on each of the upper patterns UP. For example, the active pattern AP may vertically overlap the upper pattern UP. The active pattern AP may have a linear shape extending in the second direction D2.

Each of the active patterns AP may include a channel pattern CH and source/drain patterns SD. The channel pattern CH may be between a pair of the source/drain patterns SD. The channel pattern CH of the first region RG1 may include a plurality of first semiconductor patterns NS1 that are vertically stacked. The channel pattern CH of the second region RG2 may include a plurality of second semiconductor patterns NS2 that are vertically stacked. The channel pattern CH of the third region RG3 may include a plurality of third semiconductor patterns NS3 that are vertically stacked.

The first semiconductor patterns NS1 may be spaced apart from each other in a third direction D3 perpendicular to a top surface of the substrate 100. The first semiconductor patterns NS1 may vertically overlap each other. Each of the source/drain patterns SD may be in direct contact with sidewalls of the first semiconductor patterns NS1. For example, the first semiconductor patterns NS1 may connect a pair of neighboring source/drain patterns SD to each other. The channel pattern CH of the first region RG1 may include three first semiconductor patterns NS1, as illustrated in FIGS. 2A and 2B, but the number of the first semiconductor patterns NS1 is not especially limited to three. The first semiconductor patterns NS1 may have the same thickness (e.g., in the third direction D3) as each other or different thicknesses from each other. A detailed description of the second and third semiconductor patterns NS2 and NS3 may be the same as that of the first semiconductor patterns NS1 discussed above. The first semiconductor patterns NS1, the second semiconductor patterns NS2, and the third semiconductor patterns NS3 may be referred to herein as the first to third semiconductor patterns NS1 to NS3.

Respective ones of the first to third semiconductor patterns NS1 to NS3 at the same level may be formed from the same semiconductor layer. Respective ones of the first to third semiconductor patterns NS1 to NS3 at the same level may have substantially the same thickness as each other. Respective ones of the first to third semiconductor patterns NS1 to NS3 at the same level may have substantially the same semiconductor material as each other. For example, the first to third semiconductor patterns NS1 to NS3 may include one or more of Si, SiGe, and Ge.

The source/drain patterns SD may be or include epitaxial patterns formed from the first to third semiconductor patterns NS1 to NS3 and the upper patterns UP serving as a seed layer. In some embodiments, when the first to third transistors TR1 to TR3 are PMOSFETs, the source/drain patterns SD may include a material that provides compressive strain to the channel pattern CH. For example, the source/drain patterns SD may include a semiconductor element (e.g., SiGe) whose lattice constant is greater than that of a semiconductor element of the channel pattern CH. The source/drain patterns SD may be doped with impurities to have P-type conductivity.

In some embodiments, when the first to third transistors TR1 to TR3 are NMOSFETs, the source/drain patterns SD may include a material that provides tensile strain to the channel pattern CH. For example, the source/drain patterns SD may include a semiconductor element whose lattice constant is less than that of a semiconductor element of the channel pattern CH. For other example, the source/drain patterns SD may include the same semiconductor element as that of the channel pattern CH. The source/drain patterns SD may be doped with impurities to have N-type conductivity.

First to third gate electrodes GE1, GE2, and GE3 may be provided to extend in a first direction D1, and may intersect corresponding channel patterns CH of the first to third regions RG1 to RG3. The first to third gate electrodes GE1, GE2, and GE3 may respectively include first to third work function metal patterns WF1, WF2, and WF3. The first to third gate electrodes GE1, GE2, and GE3 may respectively further include first to third electrode patterns EL1, EL2, and EL3. The first to third electrode patterns EL1, EL2, and EL3 may be respectively on the first to third work function metal patterns WF1, WF2, and WF3. The first to third electrode patterns EL1, EL2, and EL3 may have resistances lower than those of the first to third work function metal patterns WF1, WF2, and WF3. For example, the first to third electrode patterns EL1, EL2, and EL3 may include one or more low resistance metals such as aluminum (Al), tungsten (W), titanium (Ti), and/or tantalum (Ta).

The first work function metal pattern WF1 may fill a first space SP1 between the first semiconductor patterns NS1, the second work function metal pattern WF2 may fill a first space SP1 between the second semiconductor patterns NS2, and the third work function metal pattern WF3 may fill a first space SP1 between the third semiconductor patterns NS3.

The first space SP1 between the first semiconductor patterns NS1, the first space SP1 between the second semiconductor patterns NS2, and the first space SP1 between the third semiconductor patterns NS3 may have substantially the same size. For example, the first spaces SP1 at the same level (e.g., at a same distance from the substrate 100) may have the same length in the third direction D3.

The first to third work function metal patterns WF1, WF2, and WF3 may respectively surround portions of the first to third semiconductor patterns NS1 to NS3 (see FIG. 2B). For example, the first to third work function metal patterns WF1, WF2, and WF3 may surround top surfaces, bottom surfaces, and sidewalls of the first to third semiconductor patterns NS1 to NS3, respectively. In this sense, each of the first to third transistors TR1 to TR3 may be a gate-all-around type field effect transistor.

The third gate electrode GE3 may further include a barrier pattern BP between the third work function metal pattern WF3 and the third electrode pattern EL3. The first and second gate electrodes GE1 and GE2 may include no barrier pattern BP between their respective work function metal patterns WF1, WF2 and electrode patterns EL1, EL2. For example, the first electrode pattern EL1 may be on and directly contact the first work function metal pattern WF1, and the second electrode pattern EL2 may be on and directly contact the second work function metal pattern WF2. The third electrode pattern EL3 may be on and directly contact the barrier pattern BP.

For example, each of the first to third gate electrodes GE1, GE2, and GE3 may include a first part P1 and a second part P2. The first part P1 may be at the first space SP1 between vertically adjacent ones of the first to third semiconductor patterns NS1 to NS3. For example, the first part P1 may be a segment interposing between the vertically adjacent ones of the first to third semiconductor patterns NS1 to NS3.

The second part P2 may be at the second space SP2 on an uppermost one of the first to third semiconductor patterns NS1 to NS3. The second space SP2 may be an area adjacent the uppermost one of the first to third semiconductor patterns NS1 to NS3 and a pair of gate spacers GS which will be discussed below. For example, the second part P2 may be a segment on the uppermost one of the first to third semiconductor patterns NS1 to NS3 and disposed between the pair of gate spacers GS.

The first part P1 of the first gate electrode GE1 may include the first work function metal pattern WF1, the first part P1 of the second gate electrode GE2 may include the second work function metal pattern WF2, and the first part P1 of the third gate electrode GE3 may include the third work function metal pattern WF3. The first to third electrode patterns EL1, EL2, and EL3 may be spaced apart from the first parts P of the first to third gate electrodes GE1, GE2, and GE3, respectively. For example, the first to third electrode patterns EL1, EL2, and EL3 may not fill the first spaces SP1. The barrier pattern BP may be spaced apart from the first part P1 of the third gate electrode GE3. For example, the barrier pattern BP may not fill the first space SP1 between the third semiconductor patterns NS3.

The second part P2 of the first gate electrode GE1 may include the first work function metal pattern WF1 and the first electrode pattern EL1 that are sequentially stacked. The second part P2 of the second gate electrode GE2 may include the second work function metal pattern WF2 and the second electrode pattern EL2 that are sequentially stacked. The second part P2 of the third gate electrode GE3 may include the third work function metal pattern WF3, the barrier pattern BP, and the third electrode pattern EL3 that are sequentially stacked.

A pair of gate spacers GS may be on opposite sidewalls of each of the first to third gate electrodes GE1, GE2, and GE3. The gate spacers GS may extend in the first direction D1 along the first to third gate electrodes GE1, GE2, and GE3. The gate spacers GS may have top surfaces higher (e.g., farther from the substrate 100) than those of the first to third gate electrodes GE1, GE2, and GE3. The first to third work function metal patterns WF1, WF2, and WF3 on the channel patterns CH may extend in the third direction D3 along inner sidewalls of the gate spacers GS. For example, the gate spacers GS may include one or more of SiCN, SiCON, and SiN. In some embodiments, the gate spacers GS may include a multi-layer including two or more of SiCN, SiCON, and SiN.

Gate capping layers CP may be on the first to third gate electrodes GE. GE2, and GE3. The gate capping layers CP may extend in the first direction D1 along the first to third gate electrodes GE1, GE2, and GE3. The gate capping layers CP may have top surfaces coplanar with those of the gate spacers GS. The gate capping layers CP may include a material having an etch selectivity to a first interlayer dielectric layer 110 which will be discussed below. For example, the gate capping layers CP may include one or more of SiON, SiCN, SiCON, and SiN.

Insulation patterns IP may be between the source/drain patterns SD and the first to third gate electrodes GE1, GE2, and GE3. The insulation patterns IP may lie between the first semiconductor patterns NS1 vertically spaced apart from each other, between the second semiconductor patterns NS2 vertically spaced apart from each other, and between the third semiconductor patterns NS3 vertically spaced apart from each other. The insulation patterns IP may electrically insulate the first to third gate electrodes GE1, GE2, and GE3 from the source/drain patterns SD. The first space SP1 may be defined by a pair of horizontally adjacent insulation patterns IP and a pair of vertically adjacent ones of the semiconductor patterns NS1, NS2, and NS3. For example, the insulation patterns IP may include a silicon nitride layer.

An interface layer IL may be provided to surround a portion of each of the first to third semiconductor patterns NS1, NS2, and NS3. The interface layers IL may be on and directly contact the first to third semiconductor patterns NS1, NS2, and NS3. For example, the interface layers IL may include a silicon oxide layer.

Gate dielectric layers GI may be between the first to third semiconductor patterns NS1, NS2, and NS3 and the first to third gate electrodes GE1, GE2, and GE3. In some embodiments, the gate dielectric layers GI may be provided to surround a portion of each of the first to third semiconductor patterns NS1, NS2, and NS3 with a portion of the interface layer therebetween. Each of the gate dielectric layers GI may conformally fill a portion of the first space SP1. The gate dielectric layers GI may include a high-k dielectric material whose dielectric constant is greater than that of a silicon oxide layer. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The first transistor TR1 may have a threshold voltage greater than that of the second transistor TR2, and the threshold voltage of the second transistor TR2 may be greater than that of the third transistor TR3. This may be caused by a configuration in which the first to third gate electrodes GE1, GE2, and GE3 respectively include the first to third work function metal patterns WF1, WF2, and WF3 that are different from each other.

The first work function metal pattern WF1 of the first transistor TR1 may include a first work function metal layer W1. The second work function metal pattern WF2 of the second transistor TR2 may include a first work function metal layer W1 and a second work function metal layer W2. The third work function metal pattern WF3 of the third transistor TR3 may include a second work function metal layer W2. In some embodiments, the first work function metal layer W1 of the first transistor TR1 includes substantially the same composition as the first work function metal layer W1 of the second transistor TR2. In some embodiments, the second work function metal layer W2 of the second transistor TR2 includes substantially the same composition as the second work function metal layer W2 of the third transistor TR3. However, the present inventive concepts are not limited thereto. For example, in some embodiments, the first work function metal layer W1 of the first transistor TR1 may be different than the first work function metal layer W1 of the second transistor TR2, and the second work function metal layer W2 of the second transistor TR2 may be different than the second work function metal layer W2 of the third transistor TR3.

The first work function metal layer W1 may be or include a metal nitride layer having a relatively low work function. The first work function metal layer W1 may be or include a metal nitride layer doped with (or containing) silicon and/or aluminum. For example, the first work function metal layer W1 may be or include a silicon-doped titanium nitride (TiSiN) layer, a silicon-doped tantalum nitride (TaSiN) layer, an aluminum-doped titanium nitride (TiAlN) layer, and/or an aluminum-doped tantalum nitride (TaAlN) layer.

The first work function metal layer W1 may be altered in its work function by controlling a concentration of dopants such as silicon and/or aluminum. In this sense, the first work function metal pattern WF1 may be controlled in its work function by adjustment of an impurity concentration in the first work function metal layer W1. The second work function metal pattern WF2 may also be controlled in its work function by adjustment of an impurity concentration in the first work function metal layer W1 of the second work function metal pattern WF2. For example, impurities (e.g., silicon and/or aluminum) in the first work function metal layer W1 may have a concentration ranging from about 0.1 at % to about 25 at %.

The second work function metal layer W2 may be or include a metal nitride layer whose work function is greater than that of the first work function metal layer W1. For example, the second work function metal layer W2 may be or include a titanium nitride (TiN) layer and/or a titanium oxynitride (TiON) layer. The second work function metal layer W2 may substantially contain no impurity (e.g., silicon and/or aluminum).

The first spaces SP1 filled with the first to third work function metal patterns WF1, WF2, and WF3 may have substantially the same size as each other. The first work function metal pattern WF1 between the first semiconductor patterns NS1, the second work function metal pattern WF2 between the second semiconductor patterns NS2, and the third work function metal pattern WF3 between the third semiconductor patterns NS3 may have substantially the same thickness as each other.

In some embodiments, a combination of the first and second work function metal layers W1 and W2 may be used to cause the first to third work function metal patterns WF1, WF2, and WF3 to have different work functions from each other. In other embodiments, the first work function metal layer W1 may be controlled in its doping concentration to cause the first to third work function metal patterns WF1, WF2, and WF3 to have different work functions from each other.

A metallic material may diffuse more easily into the second work function metal layer W2 than into the first work function metal layer W1. If the third gate electrode GE3 includes no barrier pattern BP, the third electrode pattern EL3 may directly contact the second work function metal layer W2. In this case, a metallic material in the third electrode pattern EL3 may diffuse into the second work function metal layer W2. When the metallic material in the third electrode pattern EL3 diffuses into the second work function metal layer W2, the second work function metal layer W2 may be changed in its work function, which may eventually result in variation in the threshold voltage of the third transistor TR3.

According to some embodiments of the present inventive concepts, the barrier pattern BP may block or reduce diffusion of the metallic material in the third electrode pattern EL3. The barrier pattern BP may have layer characteristics preventing or reducing diffusion of metallic material. The barrier pattern BP may have high crystallinity or amorphous characteristics. The barrier pattern BP may be or include a silicon-doped (or silicon-containing) metal nitride layer. For example, the barrier pattern BP may be or include a silicon-doped titanium nitride (TiSiN) layer and/or a silicon-doped tantalum nitride (TaSiN) layer. The barrier pattern BP may include a material the same as or different from that of the first work function metal layer W1. For example, the barrier pattern BP and the first work function metal layer W1 may all include a silicon (Si) element. In some embodiments, a silicon concentration may be greater in the barrier pattern BP than in the first work function metal layer W1. The silicon concentration in the barrier pattern BP may fall within a range from about 20 at % to about 50 at %. As the barrier pattern BP may have a relatively high silicon concentration, layer characteristics of the barrier pattern BP may be substantially amorphous.

A first interlayer dielectric layer 110 may be provided on a surface of the substrate 100. The first interlayer dielectric layer 110 may be disposed on the device isolation layer ST and the source/drain patterns SD. The first interlayer dielectric layer 110 may have a top surface substantially coplanar with those of the gate capping layers CP. For example, the first interlayer dielectric layer 110 may include a silicon oxide layer and/or a silicon oxynitride layer.

Although not shown, contacts may be provided to penetrate the first interlayer dielectric layer 110 to connect with the source/drain patterns SD. The contacts may include a metallic material such as tungsten (W), titanium (Ti), and/or tantalum (Ta).

Figure 3:
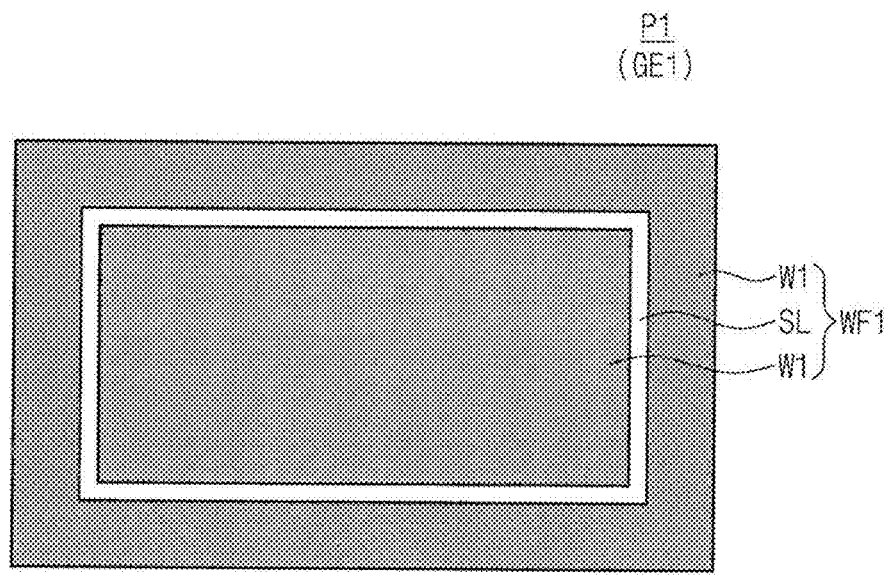
FIG. 3 illustrates an enlarged cross-sectional view of a first part in FIG. 2A, showing the first part of a first transistor included in a semiconductor device according to example embodiments of the present inventive concepts.

FIG. 3 illustrates an enlarged cross-sectional view of the first part P1 shown in FIG. 2A, showing the first part P1 of the first transistor TR1 included in a semiconductor device according to example embodiments of the present inventive concepts. In the embodiment that follows, a detailed description of technical features repetitive to those discussed above with reference to FIGS. 1, 2A, and 2B will be omitted and differences will be discussed in detail.

Referring to FIGS. 1, 2A, 2B, and 3, the first work function metal pattern WF1 may include an intermediate layer SL between the first work function metal layers W1. The intermediate layer SL may have a thickness less than that of each of the first work function metal layers W1. For example, the first work function metal layer W1 may be or include a silicon-doped titanium nitride (TiSiN) layer and/or a silicon-doped tantalum nitride (TaSiN) layer, and the intermediate layer SL may be or include a silicon (SI) layer.

Figure 4:
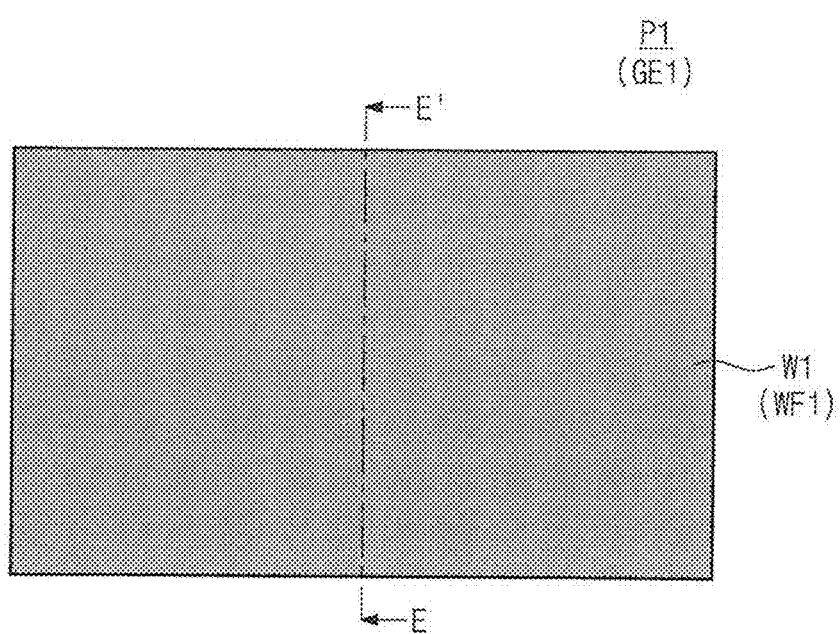
FIG. 4 illustrates an enlarged cross-sectional view of a first part in FIG. 2A, showing the first part of the first transistor included in a semiconductor device according to example embodiments of the present inventive concepts.
Figure 5A:
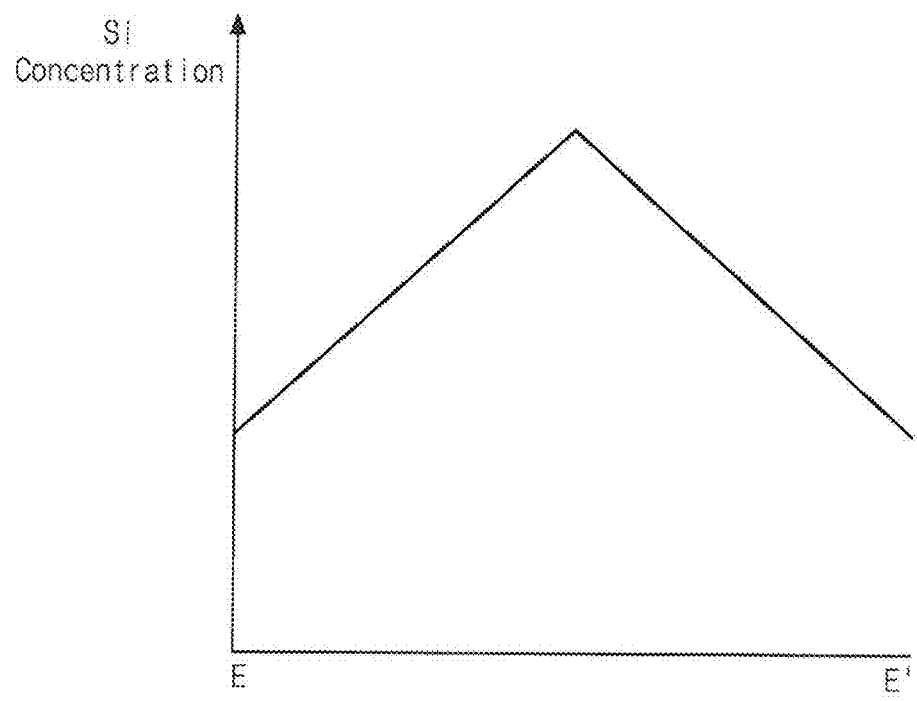
FIG. 5A illustrates a graph showing an example of a silicon concentration profile along line E-E' of FIG. 4.
Figure 5B:
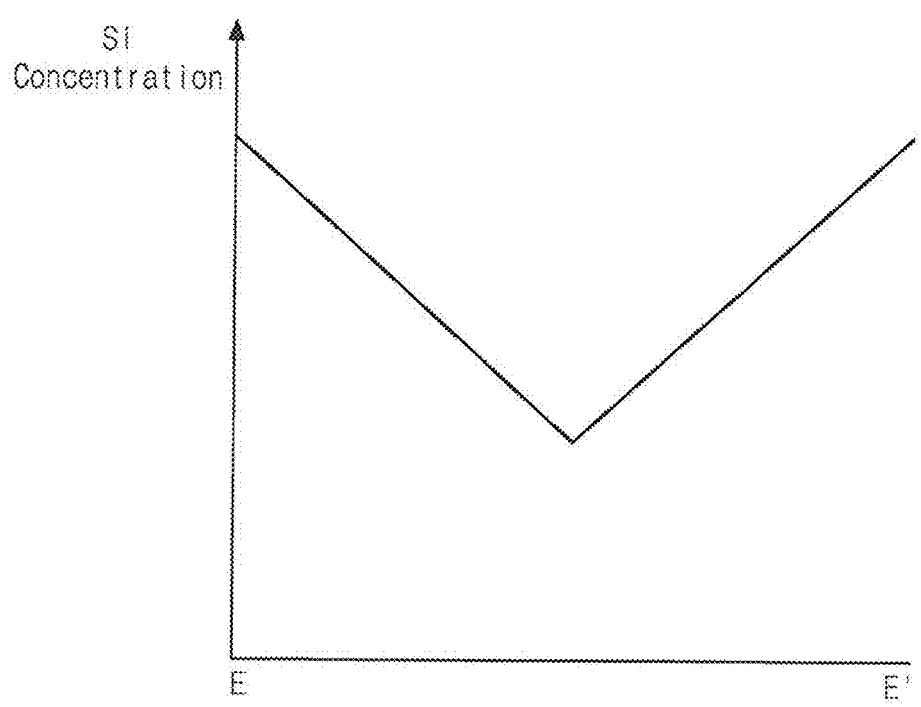
FIG. 5B illustrates a graph showing another example of a silicon concentration profile along line E-E' of FIG. 4.

FIG. 4 illustrates an enlarged cross-sectional view of the first part P1 shown in FIG. 2A, showing the first part P1 of the first transistor TR1 included in a semiconductor device according to example embodiments of the present inventive concepts. FIG. 5A illustrates a graph showing an example of a silicon concentration profile along line E-E' of FIG. 4. FIG. 5B illustrates a graph showing another example of a silicon concentration profile along line E-E' of FIG. 4. In the embodiment that follows, a detailed description of technical features repetitive to those discussed above with reference to FIGS. 1, 2A, and 2B will be omitted and differences will be discussed in detail.

Referring to FIGS. 1, 2A, 2B, 4, and 5A, the first work function metal layer W1 may be or include a silicon-doped titanium nitride (TiSiN) layer and/or a silicon-doped tantalum nitride (TaSiN) layer. In this case, the first work function metal layer W1 may have a silicon concentration gradient internally. For example, the first work function metal layer W1 may have a silicon concentration that initially increases and then decreases (e.g., varies) as the first work function metal layer W1 extends from an underlying first semiconductor pattern NS1 toward an overlying first semiconductor pattern NS1 (line E-E) (e.g., in a direction away from the substrate 100). Namely, the first work function metal layer W1 may have the highest silicon concentration at a middle point between the first semiconductor patterns NS1 vertically adjacent to each other.

Referring to FIGS. 1, 2A, 2B, 4, and 5B, the first work function metal layer W1 may have a silicon concentration that initially decreases and then increases (e.g., varies) as the first work function metal layer W1 extends from an underlying first semiconductor pattern NS1 toward an overlying first semiconductor pattern NS1 (line E-E') (e.g., in a direction away from the substrate 100). Namely, the first work function metal layer W1 may have the lowest silicon concentration at a middle point between the first semiconductor patterns NS1 vertically adjacent to each other.

FIGS. 5A and 5B show examples of the silicon concentration gradient of the first work function metal layer W1, and the silicon concentration profile in the first work function metal layer W1 may be variously changed based on a desired threshold voltage of the first transistor TR1. The silicon concentration of the first work function metal layer W1 may vary in other ways depending on a distance from the first semiconductor pattern NS1.

FIGS. 6, 8, 10, and 12 illustrate plan views showing a method of manufacturing semiconductor devices according to example embodiments of the present inventive concepts. FIGS. 7A, 9A, 11A, and 13A illustrate cross-sectional views taken along line A-A' of FIGS. 6, 8, 10, and 12, respectively. FIGS. 7B, 9B, 11B, and 13B illustrate cross-sectional views taken along line B-B' of FIGS. 6, 8, 10, and 12, respectively. FIGS. 14 to 17 illustrate cross-sectional views showing a method of forming first to third gate electrodes according to example embodiments of the present inventive concepts.

Figure 6:
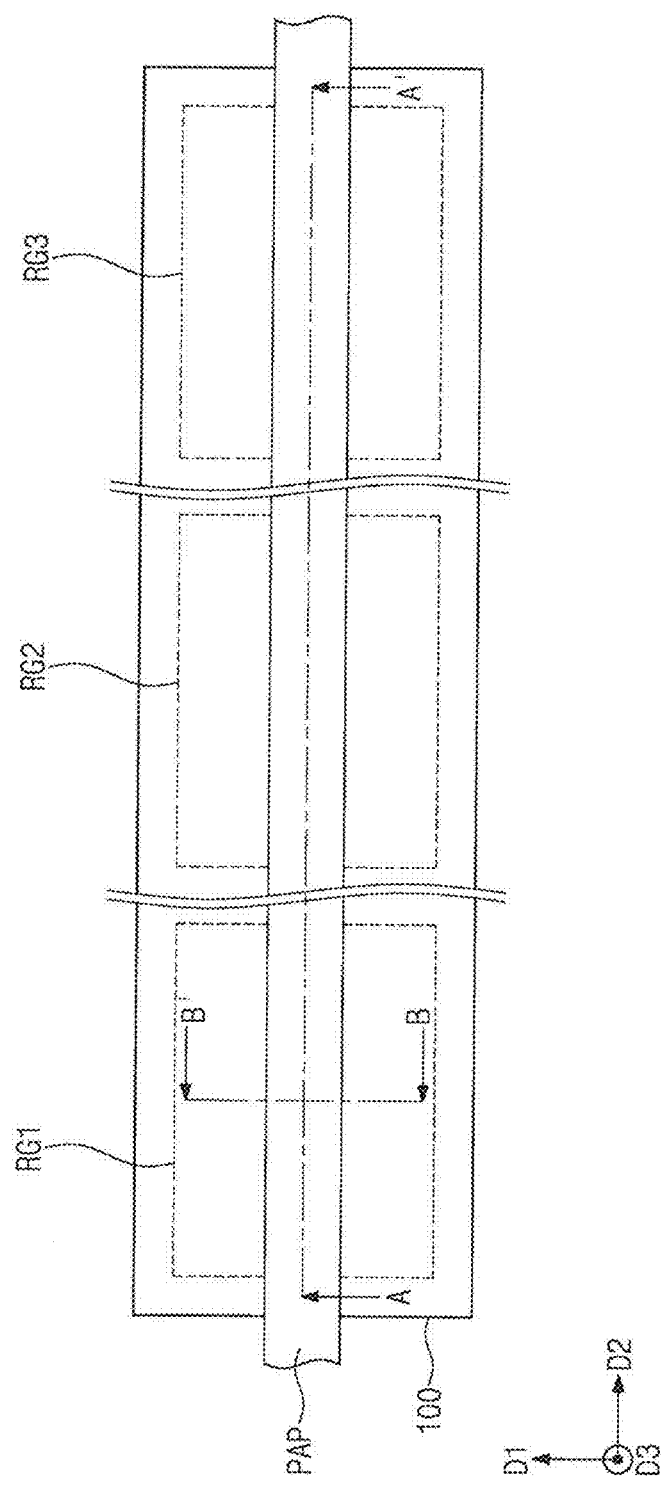
FIGS. 6, 8, 10, and 12 illustrate plan views showing a method of manufacturing semiconductor devices according to example embodiments of the present inventive concepts.
Figure 7A:
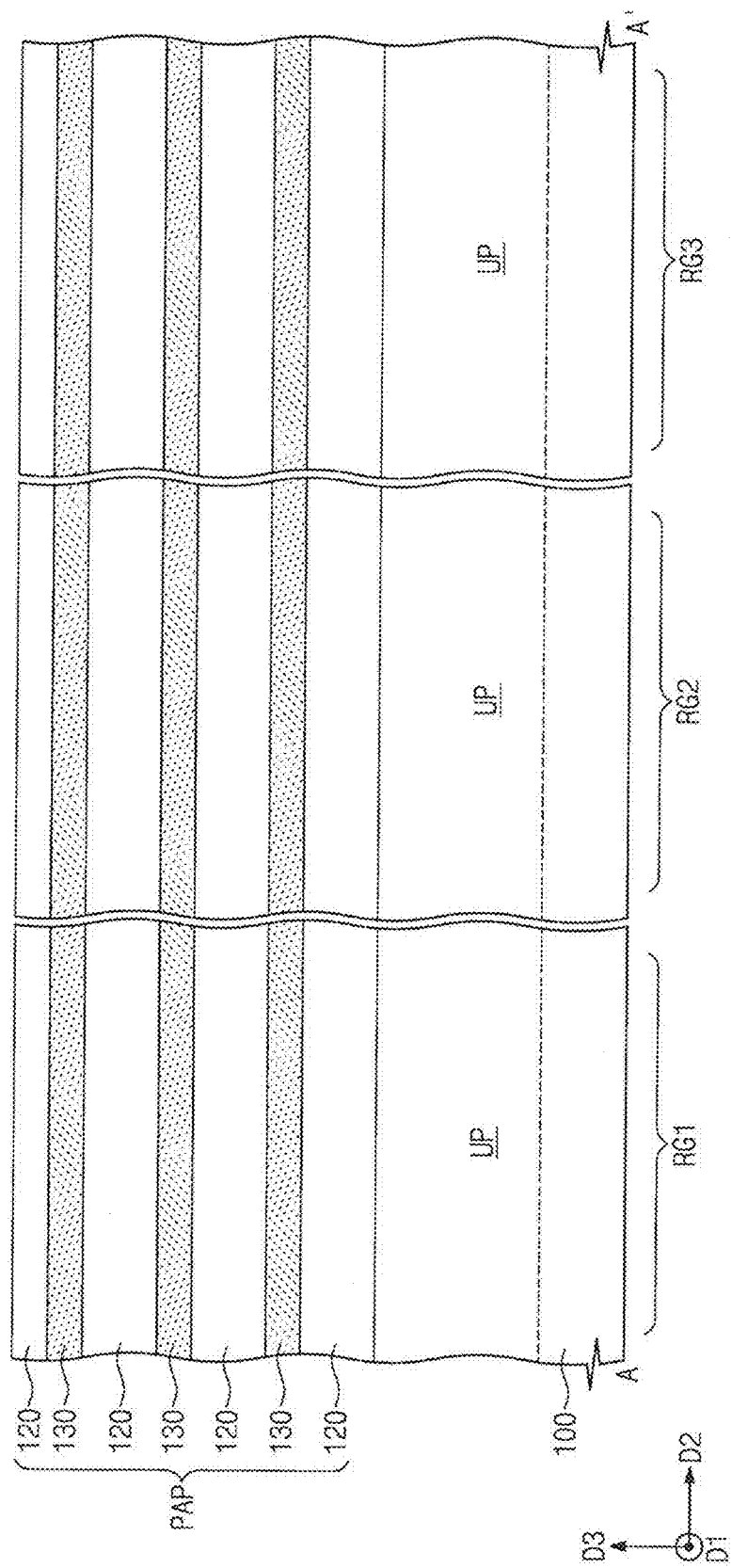
Figure 7B:
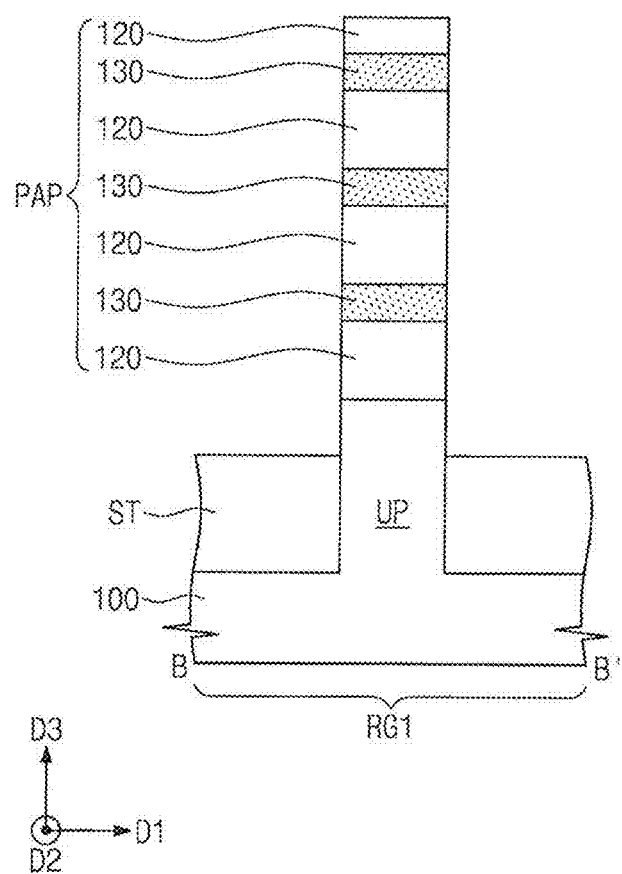
FIGS. 7B, 9B, 11B, and 13B illustrate cross-sectional views taken along line B-B' of FIGS. 6, 8, 10, and 12, respectively.

Referring to FIGS. 6, 7A, and 7B, sacrificial layers 120 and semiconductor layers 130 may be alternately and repeatedly stacked on a surface of a substrate 100. The semiconductor layers 130 may be repeatedly stacked three times, but the present inventive concepts are not limited thereto. For example, the sacrificial layers 120 may include a material having an etch selectivity to the semiconductor layers 130. For example, the semiconductor layers 130 may include a material that is not etched in a process where the sacrificial layers 120 are etched. Specifically, in the process where the sacrificial layers 120 are etched, an etch rate ratio of the sacrificial layers 120 to the semiconductor layers 130 may fall within a range from about 10:1 to about 200:1. For example, the sacrificial layers 120 may include SiGe and/or Ge, and the semiconductor layers 130 may include Si.

The sacrificial layers 120 and the semiconductor layers 130 may be formed by an epitaxial growth process in which the substrate 100 is used as a seed layer. The sacrificial layers 120 and the semiconductor layers 130 may be successively formed in the same chamber. The sacrificial layers 120 and the semiconductor layers 130 may be conformally formed on the entire surface of the substrate 100.

The sacrificial layers 120, the semiconductor layers 130, and the substrate 100 may be patterned to form preliminary active patterns PAP. The patterning process may etch an upper portion of the substrate 100 to form upper patterns UP. The preliminary active patterns PAP may lie on corresponding upper patterns UP. The preliminary active patterns PAP may be formed to have a linear and/or bar shape extending in a second direction D2.

When the patterning process etches the upper portion of the substrate 100, trenches may be formed on opposite sides of each of the upper patterns UP. A device isolation layer ST may be formed within the trenches. The formation of the device isolation layer ST may include forming an insulation layer on the entire surface of the substrate 100 and recessing the insulation layer until the preliminary active patterns PAP are completely exposed. Accordingly, the device isolation layer ST may have a top surface lower (e.g., closer to the substrate 100) than upper surfaces of the upper patterns UP.

Figure 8:
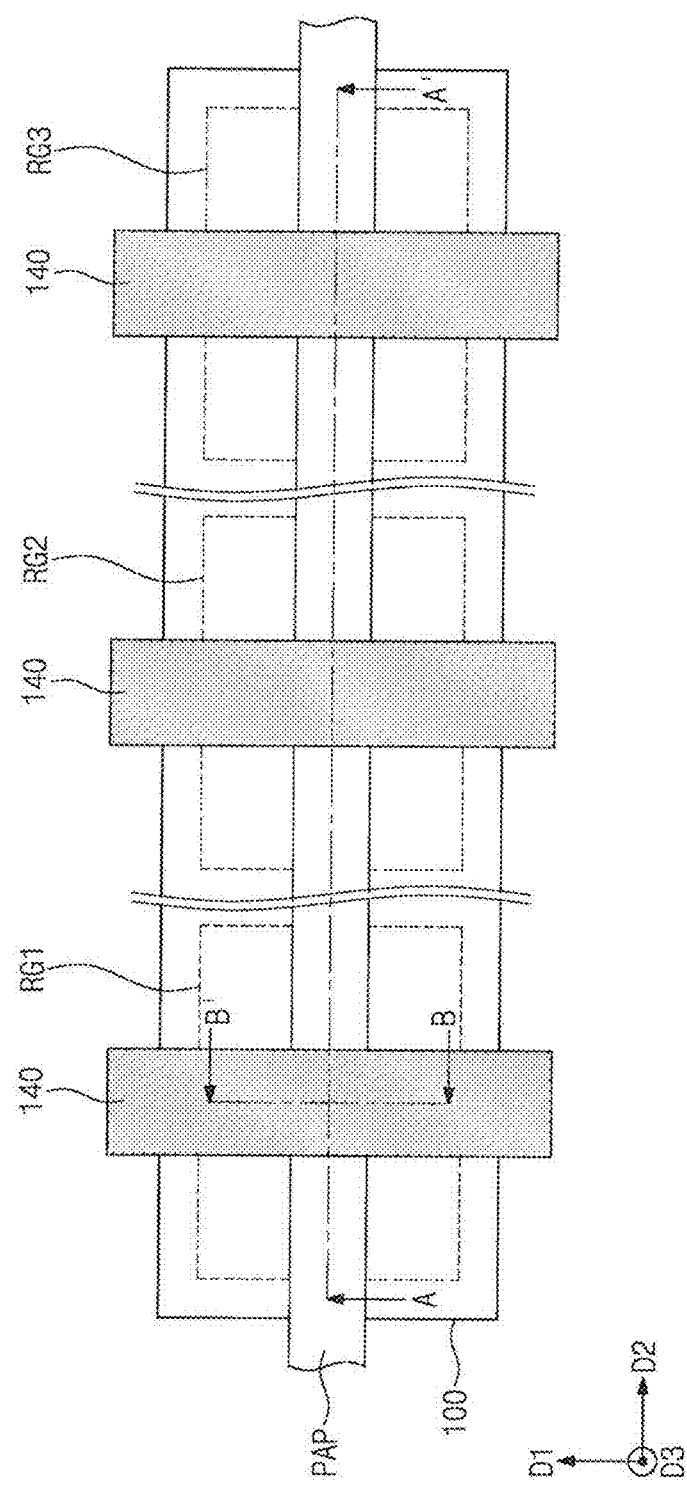
Figure 9A:
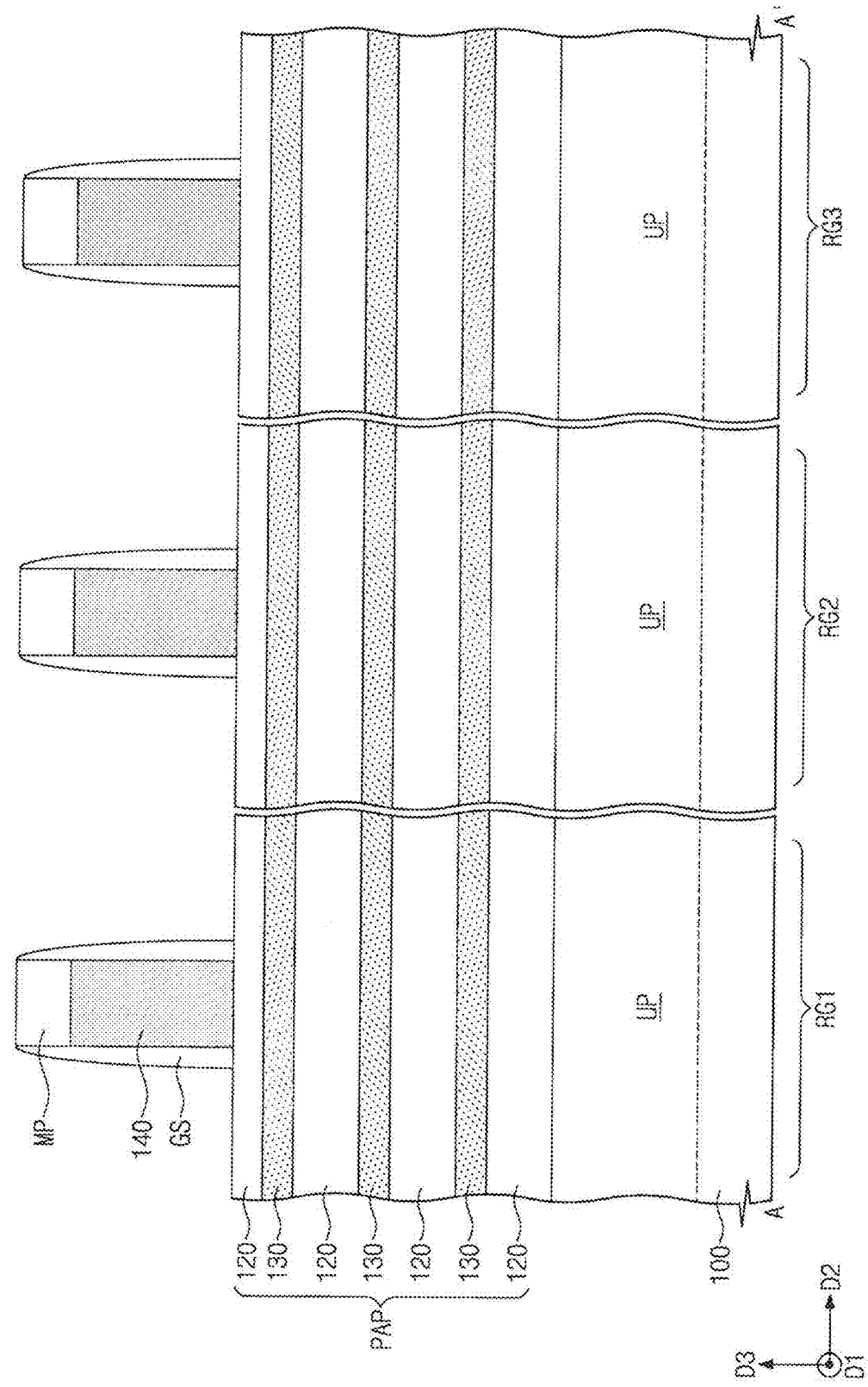
Figure 9B:
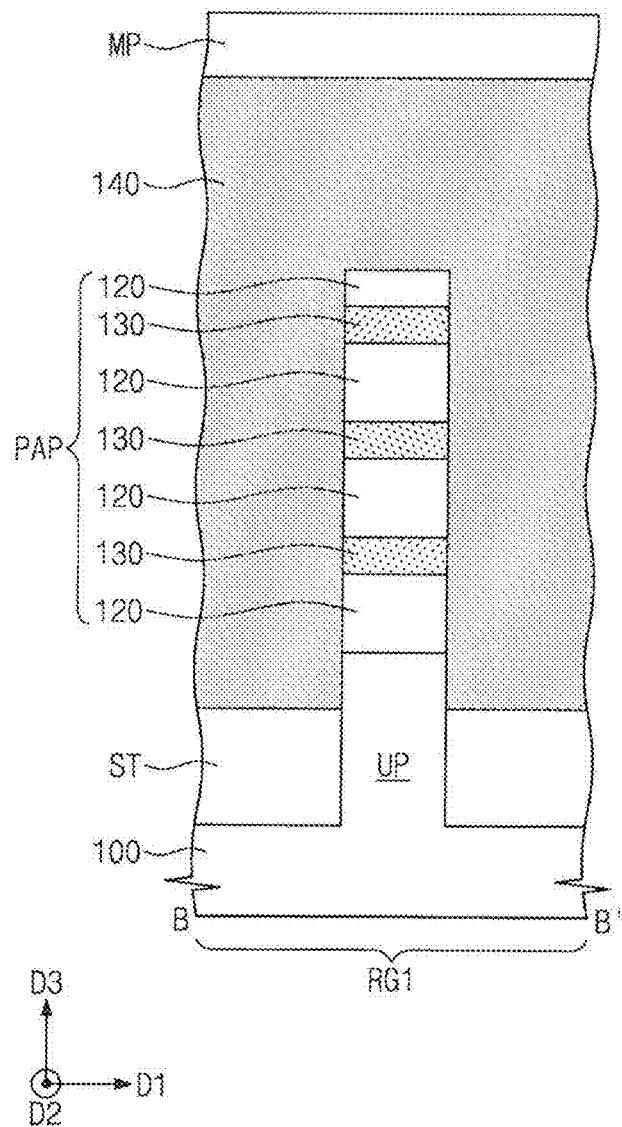

Referring to FIGS. 8, 9A, and 9B, sacrificial gate patterns 140 may be formed to intersect the preliminary active patterns PAP. The sacrificial gate patterns 140 may be formed to have a linear and/or bar shape extending in a first direction D1. Gate mask patterns MP may be provided on corresponding sacrificial gate patterns 140. The formation of the sacrificial gate patterns 140 and the gate mask patterns MP may include sequentially forming on the substrate 100 a sacrificial gate layer and a gate mask layer, and sequentially patterning the gate mask layer and the sacrificial gate layer. The sacrificial gate layer may include polysilicon, for example. The gate mask layer may include a silicon nitride layer and/or a silicon oxynitride layer, for example.

A pair of gate spacers GS may be formed on opposite sidewalls of each of the sacrificial gate patterns 140. For example, the gate spacers GS may include one or more of SiCN, SiCON, and SiN. The formation of the gate spacers GS may include forming a spacer layer by a deposition process such as CVD or ALD, and performing an anisotropic etching process on the spacer layer.

Figure 10:
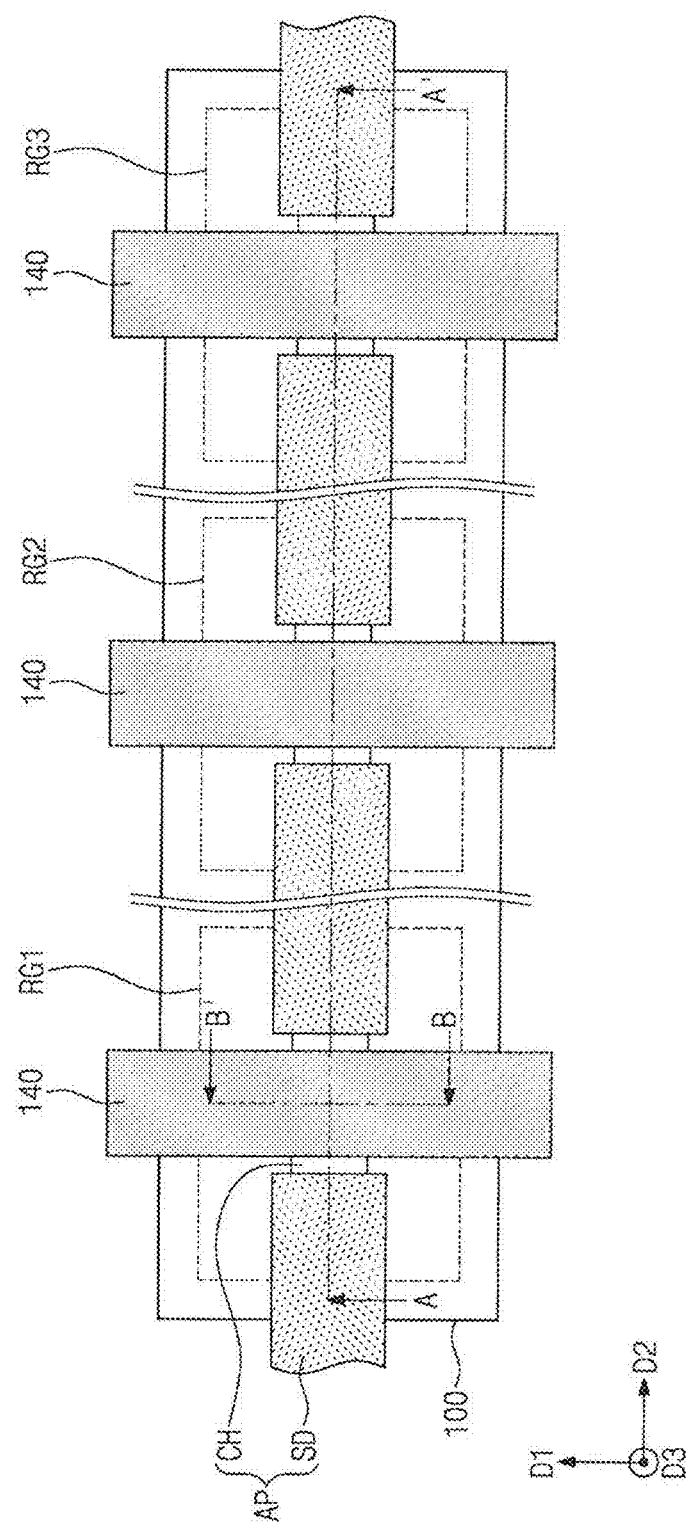
Figure 11A:
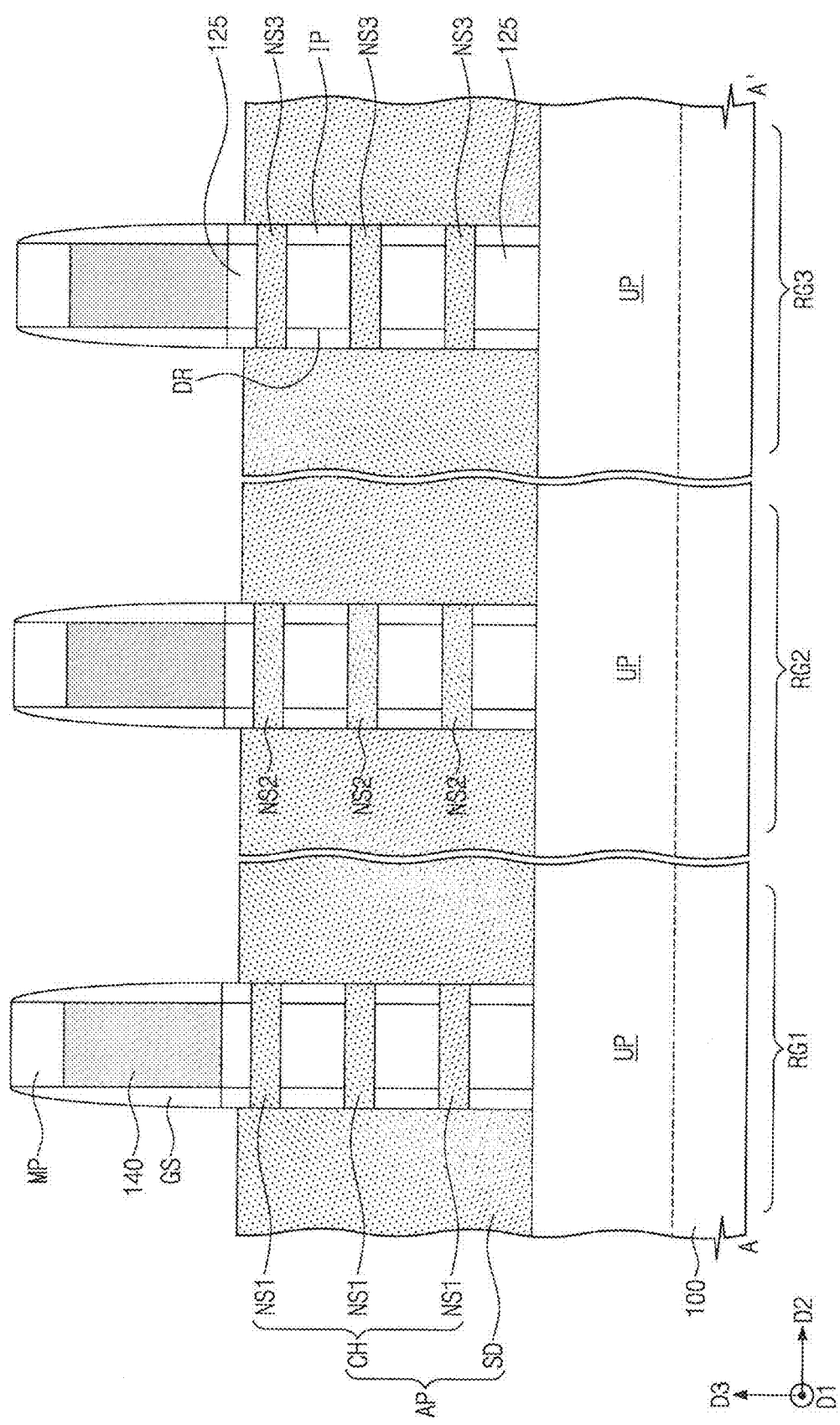
Figure 11B:
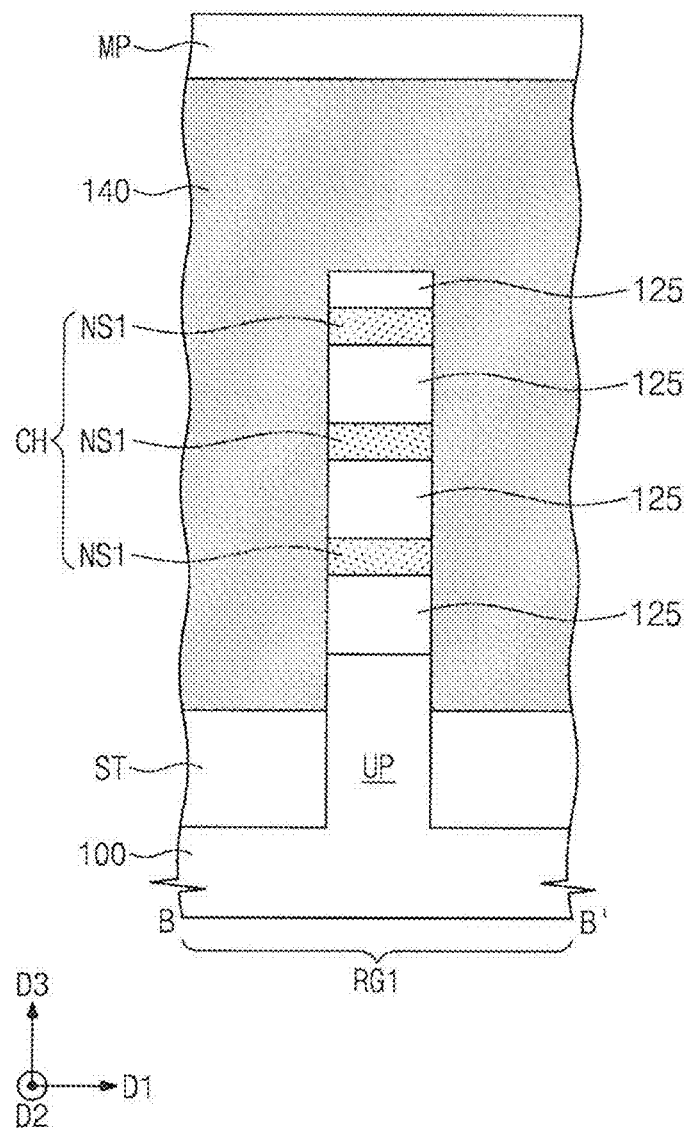

Referring to FIGS. 10, 11A, and 11B, the preliminary active patterns PAP may be patterned to form channel patterns CH. The preliminary active patterns PAP may be patterned by using the gate mask patterns MP and the gate spacers GS as an etch mask. The upper patterns UP may therefore be partially exposed through the gate mask patterns MP and the gate spacers GS.

For example, the sacrificial layers 120 of the preliminary active patterns PAP may be patterned to form sacrificial patterns 125. The semiconductor layers 130 of the preliminary active patterns PAP may be patterned to form first to third semiconductor patterns NS1, NS2, and NS3. The first semiconductor patterns NS1 may constitute the channel pattern CH of a first region RG1, the second semiconductor patterns NS2 may constitute the channel pattern CH of a second region RG2, and the third semiconductor patterns NS3 may constitute the channel pattern CH of a third region RG3.

After the patterning process, exposed portions of the sacrificial patterns 125 may be partially horizontally (e.g., in the second direction D2) removed to form depression regions DR. The formation of the depression regions DR may include performing an etching process using an etching source that exhibits an etch selectivity to the sacrificial patterns 125. For example, when the first to third semiconductor patterns NS1, NS2, and NS3 include Si, and when the sacrificial patterns 125 include SiGe, the formation of the depression regions DR may include performing an etching process with an etchant including peracetic acid.

Insulation patterns IP may be formed to fill the depression regions DR. The insulation patterns IP may be vertically spaced apart from each other across the first to third semiconductor patterns NS1, NS2, and NS3. For example, an insulation layer may be conformally formed on the entire surface of the substrate 100. The insulation layer may fill the depression regions DR. After that, the insulation layer may be etched until the insulation patterns IP remain locally in the depression regions DR.

Source/drain patterns SD may be formed on opposite sides of each of the channel patterns CH. For example, a selective epitaxial process may be performed using the first to third semiconductor patterns NS1, NS2, and NS3 and the upper patterns UP as a seed layer, thereby forming the source/drain patterns SD. The channel patterns CH and the source/drain patterns SD may be connected to each other to constitute an active pattern AP extending in the second direction D2.

In some embodiments, the source/drain patterns SD may be formed of a material that provides compressive strain to the channel patterns CH. For example, the source/drain patterns SD may be formed of SiGe whose lattice constant is greater than that of Si. Simultaneously with or after the selective epitaxial process, the source/drain patterns SD may be doped with P-type impurities.

In some embodiments, the source/drain patterns SD may be formed of the same semiconductor element (e.g., Si) as that of the channel pattern CH. Simultaneously with or after the selective epitaxial process, the source/drain patterns SD may be doped with N-type impurities.

Figure 12:
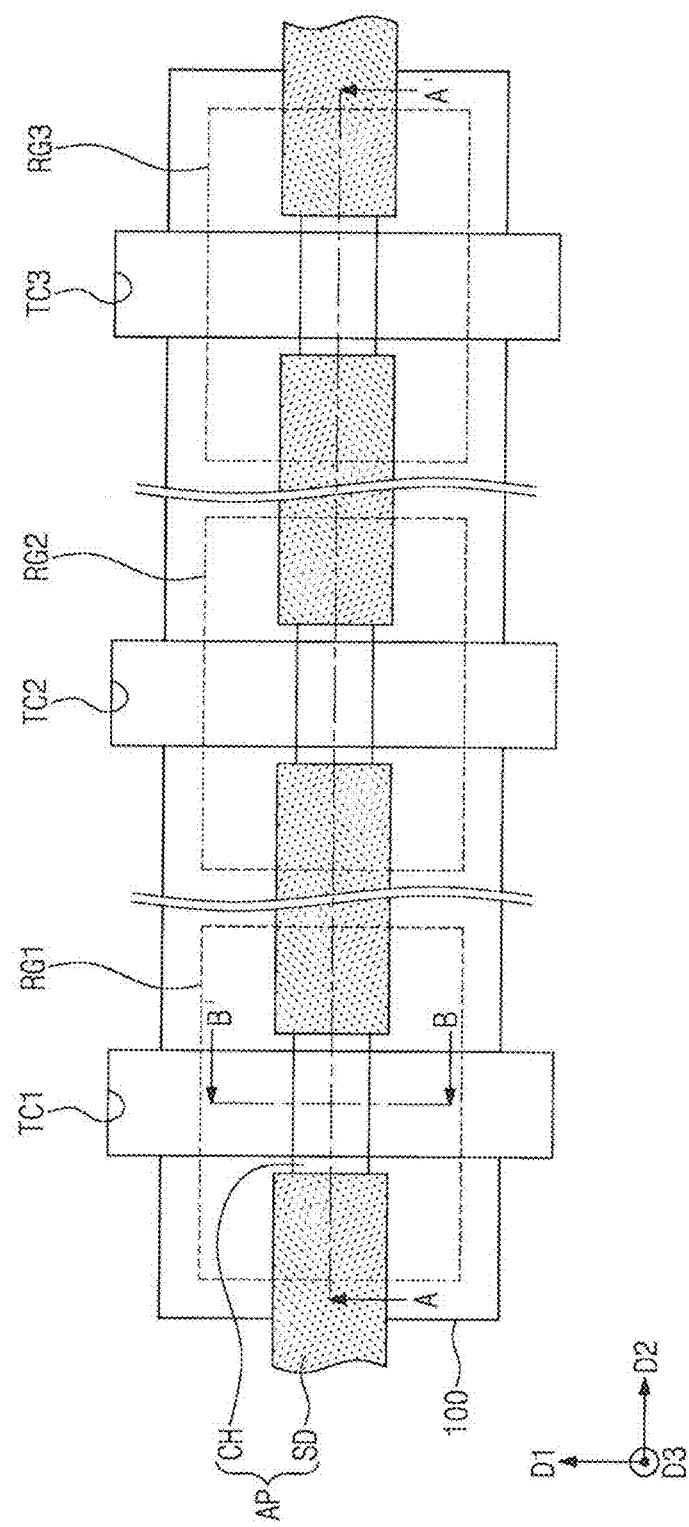
Figure 13B:
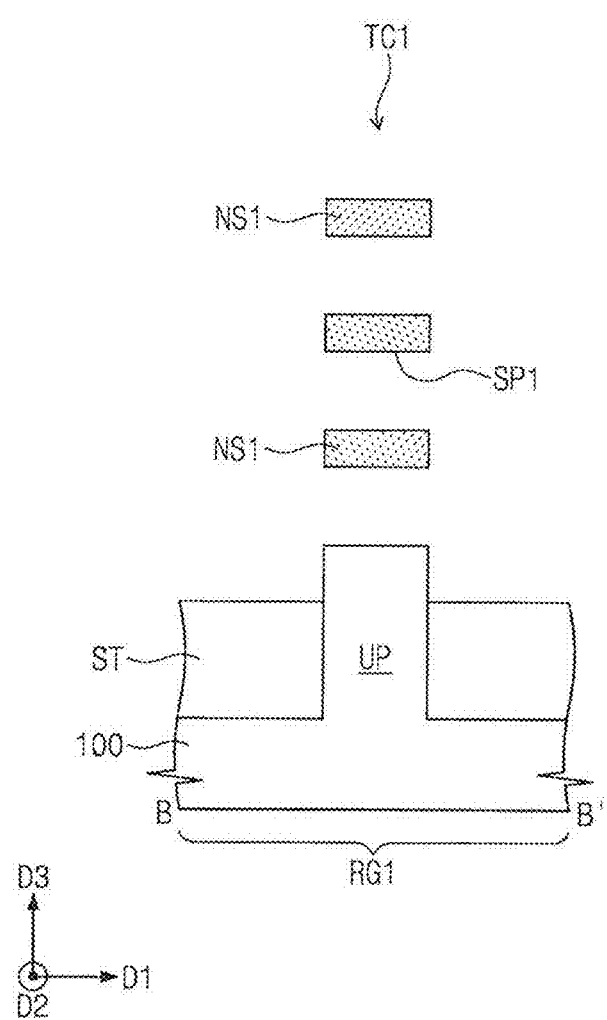

Referring to FIGS. 12, 13A, and 13B, a first interlayer dielectric layer 110 may be formed on the entire surface of the substrate 100. Thereafter, a planarization process may be performed on the first interlayer dielectric layer 110 until top surfaces of the sacrificial gate patterns 140 are exposed. The planarization process may include an etch-back process and/or a chemical mechanical polishing (CMP) process. When the first interlayer dielectric layer 110 is planarized, the gate mask patterns MP may also be removed. For example, the first interlayer dielectric layer 110 may be formed of a silicon oxide layer and/or a silicon oxynitride layer.

A process may be performed to selectively remove the sacrificial gate patterns 140 exposed when the planarization process is performed. As the sacrificial gate patterns 140 are removed, first to third trenches TC1, TC2, and TC3 may be respectively formed on first to third regions RG1, RG2, and RG3 of the substrate 100. The first to third trenches TC1, TC2, and TC3 may expose the channel patterns CHI. The first to third trenches TC1, TC2, and TC3 may also expose the sacrificial patterns 125.

The exposed sacrificial patterns 125 may be selectively removed. For example, when the sacrificial patterns 125 include SiGe, and when the first to third semiconductor patterns NS1, NS2, and NS3 include Si, the selective etching process may be performed using an etchant including peracetic acid. In some embodiments, the etchant may include hydrofluoric acid (HF) solution and deionized water. The source/drain patterns SD may be covered with the insulation patterns IP and the first interlayer dielectric layer 110, and may thereby be protected from the selective etching process.

The sacrificial patterns 125 may be removed to form first spaces SP1 and second spaces SP2 on the first to third regions RG1 to RG3. The first space SP1 may be an area between vertically adjacent ones of the first to third semiconductor patterns NS1, NS2, and NS3. The second space SP2 may be an area between a pair of the gate spacers GS and on an uppermost one of the first to third semiconductor patterns NS1, NS2, and NS3. The first and second spaces SP1 and SP2 may be spatially connected to the first to third trenches TC1, TC2, and TC3 to expose the first to third semiconductor patterns NS1, NS2, and NS3.

Referring back to FIGS. 1, 2A, and 2B, first to third gate electrodes GE1, GE2, and GE3 may be respectively formed in the first to third trenches TC1, TC2, and TC3. The formation of the first to third gate electrodes GE1, GE2, and GE3 will be discussed below with reference to FIGS. 14 to 17. Gate capping layers CP may be formed on the first to third gate electrodes GE1, GE2, and GE3. For example, the gate capping layers CP may include one or more of SiON, SiCN, SiCON, and SiN. Although not shown, contacts may be formed to penetrate the first interlayer dielectric layer 110 to connect with the source/drain patterns SD.

The formation of the first to third gate electrodes GE1, GE2, and GE3 respectively in the first to third trenches TC1, TC2, and TC3 will be discussed below with reference to FIGS. 14 to 17.

Referring to FIG. 14, an oxidation process using plasma may be performed on the first to third semiconductor patterns NS1, NS2, and NS3 exposed to the first to third trenches TC1, TC2, and TC3. Interface layers IL may therefore be grown from the first to third semiconductor patterns NS1, NS2, and NS3. The interface layers IL may be on and directly contact surfaces of the exposed first to third semiconductor patterns NS1, NS2, and NS3.

The formation of the interface layers IL may include a thermal oxidation process and/or a chemical oxidation process. The oxidation process may use one or more of oxygen plasma, ozone plasma, and vapor plasma. For example, the interface layers IL may include a silicon oxide layer.

Gate dielectric layers GI may be conformally formed on the interface layers IL. The gate dielectric layers GI may partially fill the first spaces SP1 of the first to third trenches TC1 to TC3. The gate dielectric layers GI may partially fill the second spaces SP2 of the first to third trenches TC1 to TC3. The gate dielectric layers GI may be on and directly contact the insulation patterns IP and the interface layers IL. The gate dielectric layers GI may be formed using a high-k dielectric material whose dielectric constant is greater than that of a silicon oxide layer.

Figure 15:
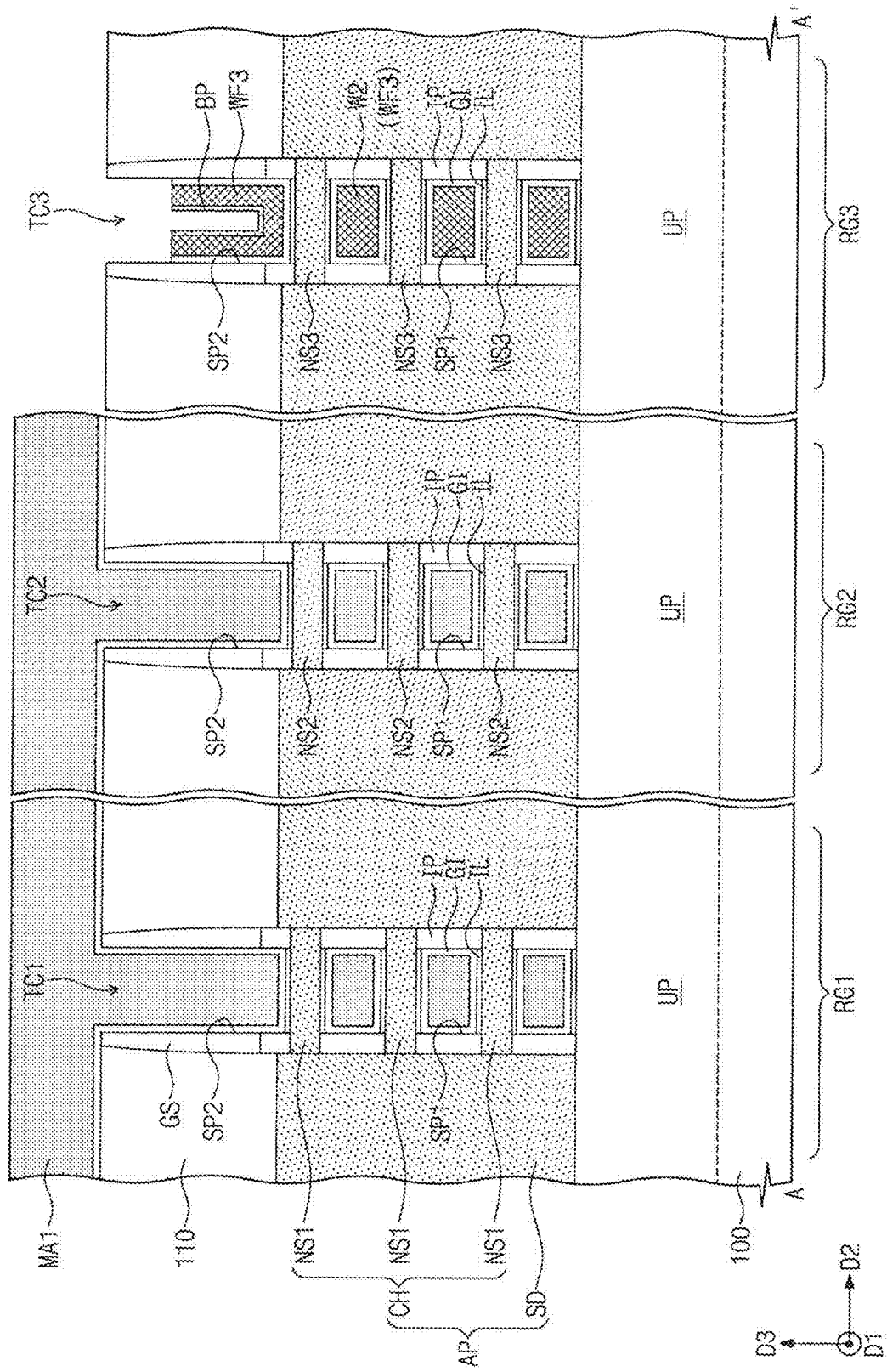

Referring to FIG. 15, a first mask pattern MA1 may be formed on the first and second regions RG1 and RG2. The first mask pattern MA1 may selectively expose the third region RG3. The first mask pattern MA1 may completely fill the first and second trenches TC1 and TC2. The first mask pattern MA1 may not fill the third trench TC3.

A third work function metal pattern WF3 may be formed in the third trench TC3 selectively exposed by the first mask pattern MA1. The third work function metal pattern WF3 may be formed to completely fill the first space SP1 of the third trench TC3. The third work function metal pattern WF3 may be formed to partially fill the second space SP2 of the third trench TC3.

The formation of the third work function metal pattern WF3 may include conformally forming a second work function metal layer W2 in the third trench TC3. The second work function metal layer W2 may be formed by a deposition process such as ALD. The second work function metal layer W2 may be or include a metal nitride layer having a relatively high work function.

A barrier pattern BP may be formed on the third work function metal pattern WF3. The barrier pattern BP may not fill the first space SP1 of the third trench TC3. The barrier pattern BP may be formed to partially fill the second space SP2 of the third trench TC3. The formation of the barrier pattern BP may include conformally forming a barrier metal layer in the third trench TC3. The barrier metal layer may be formed by a deposition process such as ALD. The barrier metal layer may have layer characteristics preventing diffusion of metallic material, and may be or include a silicon-containing metal nitride layer.

After that, a process may be performed to recess an upper portion of the gate dielectric layer GI in the third trench TC3, an upper portion of the second work function metal layer W2 in the third trench TC3, and an upper portion of the barrier metal layer in the third trench TC3.

Figure 16:
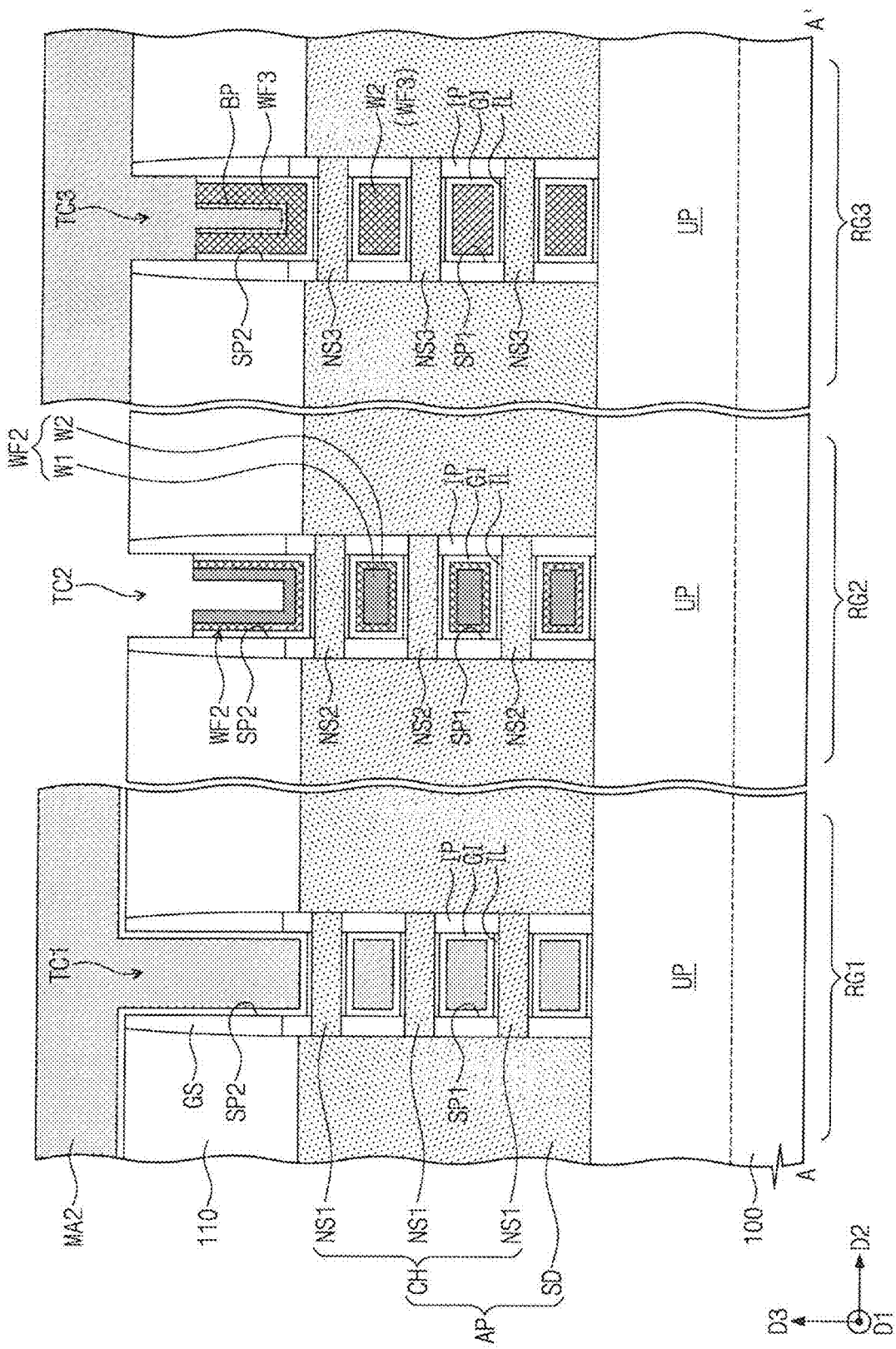

Referring to FIG. 16, the first mask pattern MA1 may be removed. A second mask pattern MA2 may be formed on the first and third regions RG1 and RG3. The second mask pattern MA2 may selectively expose the second region RG2. The second mask pattern MA2 may completely fill the first and third trenches TC1 and TC3. The second mask pattern MA2 may not fill the second trench TC2.

A second work function metal pattern WF2 may be formed in the second trench TC2 selectively exposed by the second mask pattern MA2. The second work function metal pattern WF2 may be formed to completely fill the first space SP1 of the second trench TC2. The second work function metal pattern WF2 may be formed to partially fill the second space SP2 of the second trench TC2.

The formation of the second work function metal pattern WF2 may include conformally forming a second work function metal layer W2 in the second trench TC2, conformally forming a first work function metal layer W1 on the second work function metal layer W2, and recessing upper portions of the first work function metal layer W1, the second work function metal layer W2, and the gate dielectric layer GI in the second trench TC2. The first work function metal layer W1 may be or include a metal nitride layer whose work function is less than that of the second work function metal layer W2. In some embodiments, the second work function metal layer W2 of the second work function metal pattern WF2 may include substantially the same composition as the second work function metal layer W2 of the third work function metal pattern WF3. However, the present inventive concepts are not limited thereto. For example, in some embodiments, the composition of the second work function metal layer W2 of the second work function metal pattern WF2 may be different than the second work function metal layer W2 of the third work function metal pattern WF3. That is to say that since the third region RG3 is selectively masked during the formation of the second work function metal pattern WF2, different materials may be used for the second work function metal layer W2 in some embodiments.

Figure 17:
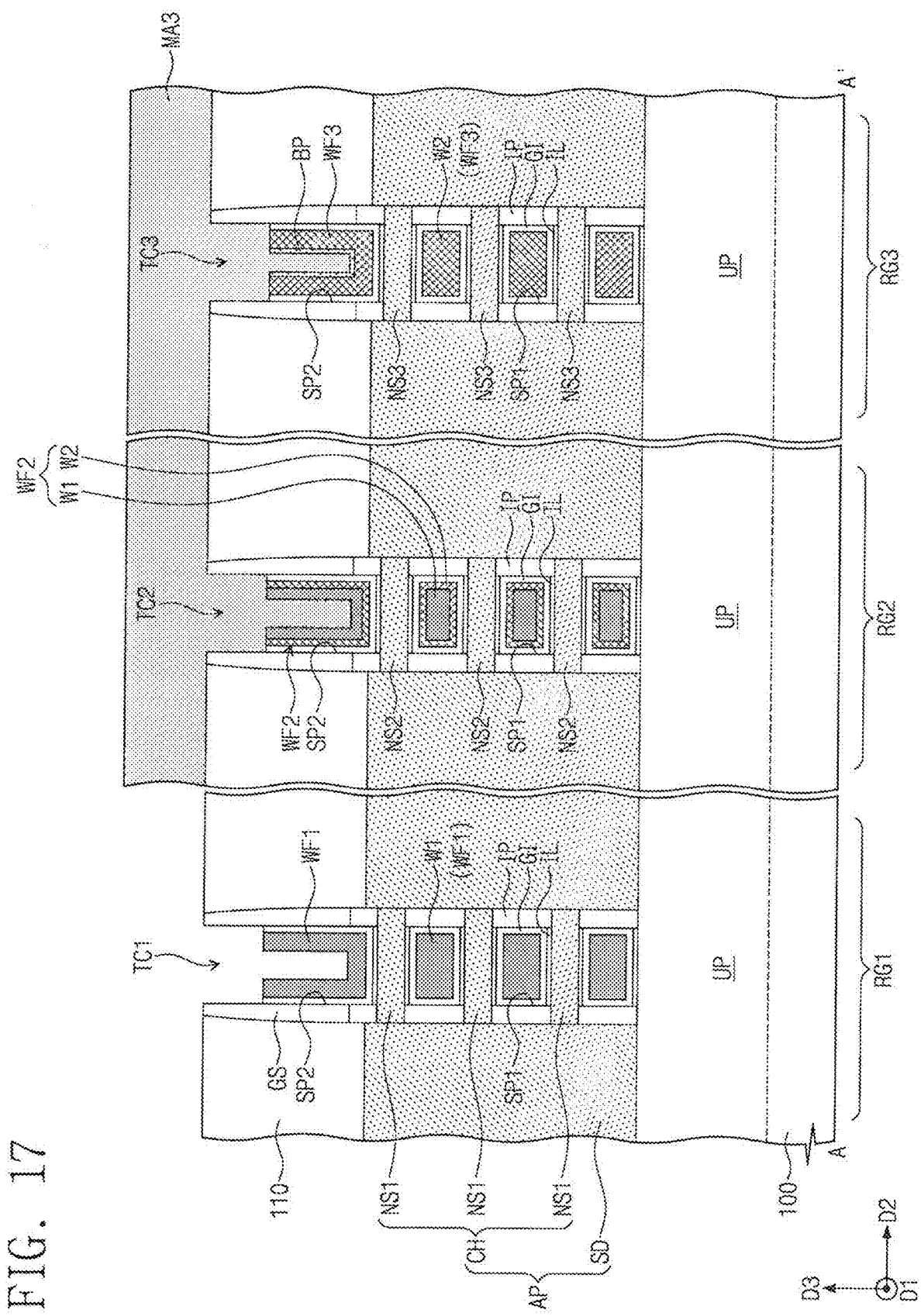

Referring to FIG. 17, the second mask pattern MA2 may be removed. A third mask pattern MA3 may be formed on the second and third regions RG2 and RG3. The third mask pattern MA3 may selectively expose the first region RG1. The third mask pattern MA3 may completely fill the second and third trenches TC2 and TC3. The third mask pattern MA3 may not fill the first trench TC1.

A first work function metal pattern WF1 may be formed in the first trench TC1 selectively exposed by the third mask pattern MA3. The first work function metal pattern WF1 may be formed to completely fill the first space SP1 of the first trench TC1. The first work function metal pattern WF1 may be formed to partially fill the second space SP2 of the first trench TC1.

The formation of the first work function metal pattern WF1 may include conformally forming a first work function metal layer W1 in the first trench TC1 and recessing an upper portion of the first work function metal layer W1 and the gate dielectric layer GI in the first trench TC1. The first work function metal layer W1 may be formed by a deposition process such as ALD. In some embodiments, the first work function metal layer W1 of the first work function metal pattern WF1 may include substantially the same composition as the first work function metal layer W1 of the second work function metal pattern WF2. However, the present inventive concepts are not limited thereto. For example, in some embodiments, the composition of the first work function metal layer W1 of the first work function metal pattern WF1 may be different than the first work function metal layer W1 of the second work function metal pattern WF2. That is to say that since the second region RG2 is selectively masked during the formation of the first work function metal pattern WF1, different materials may be used for the first work function metal layer W1 in some embodiments.

In some embodiments, when the deposition process is performed to form the first work function metal layer W1, only a silicon precursor (e.g., silane gas) may be introduced into a chamber in which the substrate 100 is loaded, and may then remain for a predetermined time. This step may form an intermediate layer SL as discussed above with reference to FIG. 3.

In certain embodiments, when the deposition process is performed to form the first work function metal layer W1, an ALD cycle may be carried out while changing an introduction amount of the silicon precursor. This step may cause the first work function metal layer W1 to have a silicon concentration gradient as discussed above with reference to FIGS. 4, 5A, and 5B.

Referring back to FIG. 2A, the third mask pattern MA3 may be removed. First to third electrode patterns EL1, EL2, and EL3 may be respectively formed in the first to third trenches TC1, TC2, and TC3. The first to third electrode patterns EL1 to EL3 may be respectively formed on the first to third work function metal patterns WF1 to WF3. A low resistance material may be used to form the first to third electrode patterns EL1, EL2, and EL3.

According to example embodiments of the present inventive concepts, the first to third regions RG1 to RG3 may be provided thereon with gate-all-around type transistors having different threshold voltages from each other.

A semiconductor device according to the present inventive concepts may be configured such that the gate-all-around type transistors are achieved to have various threshold voltages caused by a combination of the work function metal layers. Furthermore, a metallic material may be prevented from diffusing into the work function metal layer from the low resistance metal layer, with the result that the threshold voltage of the transistor may be controlled.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Although example embodiments of the present inventive concepts have been discussed with reference to accompanying figures, it will be understood that various changes in form and details may be made therein without departing from the spirit and scope of the present inventive concepts. It therefore will be understood that the embodiments described above are just illustrative but not limitative in all aspects.

What is claimed is:

1. A semiconductor device, comprising:
a substrate including a first region, a second region, and a third region; and
a first transistor, a second transistor, and a third transistor that are on the first region, the second region, and the third region, respectively,
wherein each of the first, second, and third transistors comprises:
semiconductor patterns vertically stacked on the substrate; and
a gate electrode between a pair of the semiconductor patterns vertically adjacent to each other,
wherein the gate electrode of the first transistor comprises a first metal nitride layer,
wherein the gate electrode of the second transistor comprises a second metal nitride layer and the first metal nitride layer on the second metal nitride layer,
wherein the gate electrode of the third transistor comprises the second metal nitride layer, and
wherein the first metal nitride layer comprises silicon.

2. The semiconductor device of claim 1, wherein respective threshold voltages of the first, second, and third transistors are different from each other.

3. The semiconductor device of claim 1, wherein the first, second, and third transistors are PMOSFETs,
wherein a threshold voltage of the first transistor is greater than a threshold voltage of the second transistor, and
wherein the threshold voltage of the second transistor is greater than a threshold voltage of the third transistor.

4. The semiconductor device of claim 1, wherein the second metal nitride layer of the second transistor is between the first metal nitride layer of the second transistor and the semiconductor patterns of the second transistor.

5. The semiconductor device of claim 1, wherein the first metal nitride layer of the first transistor has a silicon concentration that varies based on a distance from the substrate.

6. The semiconductor device of claim 5, wherein the silicon concentration of the first metal nitride layer of the first transistor falls within a range from 0.1 at % to 25 at %.

7. The semiconductor device of claim 1, wherein the gate electrode is on a top surface, a bottom surface, and sidewalls of respective ones of the semiconductor patterns.

8. The semiconductor device of claim 1, wherein the gate electrode of the third transistor further comprises a barrier pattern on an uppermost one of the semiconductor patterns,
wherein the barrier pattern comprises a third metal nitride layer comprising silicon, and
wherein a silicon concentration of the third metal nitride layer is greater than that of the first metal nitride layer.

9. A semiconductor device, comprising a first transistor on a substrate, the first transistor comprising:
a first semiconductor pattern and a second semiconductor pattern stacked on the first semiconductor pattern, the first and second semiconductor patterns being vertically spaced apart from each other; and
a first gate electrode between the first and second semiconductor patterns,
wherein the first gate electrode comprises a first metal nitride layer comprising silicon, and
wherein a silicon concentration of the first metal nitride layer varies from the first semiconductor pattern to the second semiconductor pattern.

10. The semiconductor device of claim 9, wherein the silicon concentration of the first metal nitride layer increases from the first semiconductor pattern to a maximum value, and then decreases toward the second semiconductor pattern.

11. The semiconductor device of claim 9, wherein the silicon concentration of the first metal nitride layer decreases from the first semiconductor pattern to a minimum value, and then increases toward the second semiconductor pattern.

12. The semiconductor device of claim 9, further comprising a second transistor on the substrate, the second transistor comprising:
a third semiconductor pattern and a fourth semiconductor pattern stacked on the third semiconductor pattern, the third and fourth semiconductor patterns being vertically spaced apart from each other; and
a second gate electrode between the third and fourth semiconductor patterns,
wherein the second gate electrode comprises a second metal nitride layer and a third metal nitride layer on the second metal nitride layer,
wherein the third metal nitride layer comprises silicon, and
wherein respective threshold voltages of the first and second transistors are different from each other.

13. The semiconductor device of claim 12, wherein the first and second transistors are PMOSFETs, and
wherein the threshold voltage of the first transistor is greater than that of the second transistor.

14. The semiconductor device of claim 12, further comprising a third transistor on the substrate, the third transistor comprising:
a fifth semiconductor pattern and a sixth semiconductor pattern stacked on the fifth semiconductor pattern, the fifth and sixth semiconductor patterns being vertically spaced apart from each other; and
a third gate electrode between the fifth and sixth semiconductor patterns,
wherein the third gate electrode comprises a fourth metal nitride layer,
wherein respective threshold voltages of the first, second, and third transistors are different from each other.

15. A semiconductor device, comprising a first transistor, a second transistor, and a third transistor on a substrate,
wherein each of the first, second, and third transistors comprises:
semiconductor patterns vertically stacked on the substrate;
a pair of source/drain patterns on the substrate, the semiconductor patterns being between the pair of source/drain patterns and connecting the pair of source/drain patterns to each other; and
a gate electrode surrounding each of the semiconductor patterns while traversing the semiconductor patterns,
wherein the gate electrode of each of the first, second, and third transistors comprises a first portion in a first space between a pair of the semiconductor patterns vertically adjacent to each other, and a second portion in a second space that is on an uppermost one of the semiconductor patterns,
wherein the first portion of the gate electrode of the first transistor comprises a first metal silicon nitride layer,
wherein the first portion of the gate electrode of the second transistor comprises a combination of a first metal nitride layer and a second metal silicon nitride layer,
wherein the first portion of the gate electrode of the third transistor comprises a second metal nitride layer, and
wherein respective threshold voltages of the first, second, and third transistors are different from each other.

16. The semiconductor device of claim 15, wherein each of the first and second metal nitride layers is a titanium nitride layer, and
wherein each of the first and second metal silicon nitride layers is a titanium silicon nitride layer or a tantalum silicon nitride layer.

17. The semiconductor device of claim 15, wherein the first, second, and third transistors are PMOSFETs,
wherein the threshold voltage of the first transistor is greater than the threshold voltage of the second transistor, and
wherein the threshold voltage of the second transistor is greater than the threshold voltage of the third transistor.

18. The semiconductor device of claim 15, wherein the gate electrode is on a top surface, a bottom surface, and sidewalls of respective ones of the semiconductor patterns.

19. The semiconductor device of claim 15, wherein the first metal silicon nitride layer of the first transistor has a silicon concentration that varies based on a distance from the substrate.

20. The semiconductor device of claim 15, wherein a silicon concentration of the first metal silicon nitride layer of the first transistor falls within a range from 0.1 at % to 25 at %.

* * * * *